United States Patent
Ogawa

(10) Patent No.: US 8,871,532 B2
(45) Date of Patent: Oct. 28, 2014

(54) METHOD OF MANUFACTURING SEMICONDUCTOR DEVICE

(75) Inventor: Yasuhiro Ogawa, Nanae (JP)

(73) Assignee: Renesas Electronics Corporation, Kanagawa (JP)

( * ) Notice: Subject to any disclaimer, the term of this patent is extended or adjusted under 35 U.S.C. 154(b) by 67 days.

(21) Appl. No.: 13/611,801

(22) Filed: Sep. 12, 2012

(65) Prior Publication Data

US 2013/0102093 A1    Apr. 25, 2013

(30) Foreign Application Priority Data

Oct. 20, 2011    (JP) .................... 2011-230673

(51) Int. Cl.
*H01L 21/50* (2006.01)
*H01L 23/00* (2006.01)

(52) U.S. Cl.
CPC ............ *H01L 24/97* (2013.01); *H01L 2224/97* (2013.01); *H01L 2224/48247* (2013.01); *H01L 2924/13091* (2013.01)
USPC .......................................................... 438/15

(58) Field of Classification Search
None
See application file for complete search history.

(56) References Cited

U.S. PATENT DOCUMENTS

| | | | | |
|---|---|---|---|---|
| 6,492,599 B1 * | 12/2002 | Sugihara | ........................ | 174/258 |
| 6,596,561 B2 | 7/2003 | Takahashi et al. | | |
| 6,885,203 B1 * | 4/2005 | Woodberry | .............. | 324/750.05 |
| 7,015,069 B2 | 3/2006 | Takahashi et al. | | |
| 2006/0220668 A1 * | 10/2006 | Yamashita et al. | ............ | 324/765 |

FOREIGN PATENT DOCUMENTS

| | | |
|---|---|---|
| JP | 06-174786 A | 6/1994 |
| JP | 10-242608 A | 9/1998 |
| JP | 2004-172647 A | 6/2004 |

* cited by examiner

*Primary Examiner* — Charles Garber
*Assistant Examiner* — Stanetta Isaac
(74) *Attorney, Agent, or Firm* — Mattingly & Malur, PC

(57) ABSTRACT

A method of manufacturing a semiconductor device which solves a problem with a burn-in process where current and voltage are applied to finished semiconductor devices at high-temperature. The method uses an organic multilayer wiring substrate for a burn-in board in which power supply/grounding wiring is formed with microscopic openings formed at least almost all over the areas around sockets over the front or back surface of the substrate. For increasing the supply voltage and reference voltage for the burn-in board and other purposes, whenever possible, signal wires are disposed in inner wiring layers of the board. The related-art burn-in board which has a solid or blanket-type conductor pattern in an outermost layer as wiring for supply or reference voltage may cause an insulating protective film over the metal wiring to peel due to weak adhesion between the wiring and film when thermal cycles are repeated. The method solves the problem.

12 Claims, 27 Drawing Sheets

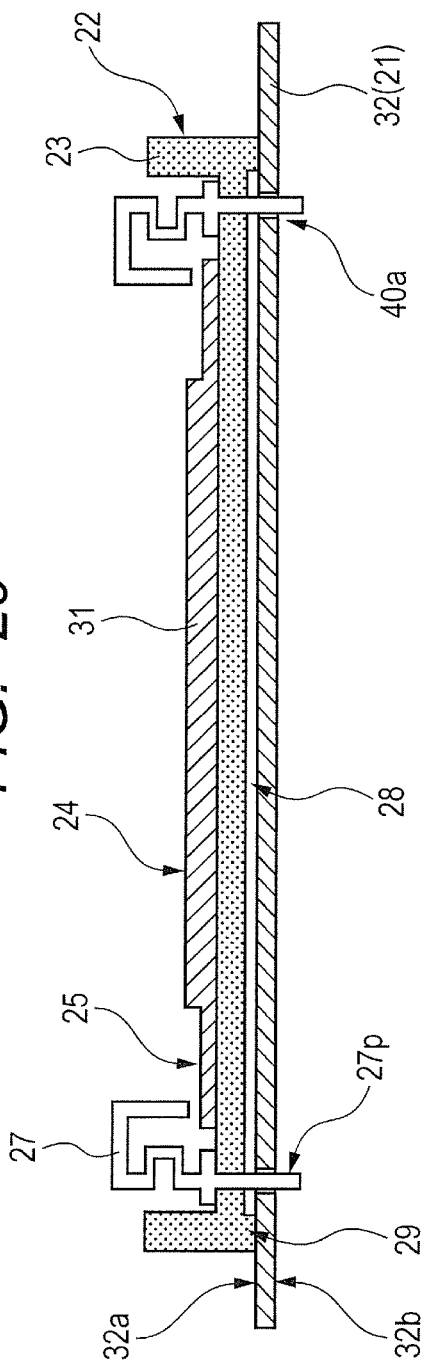
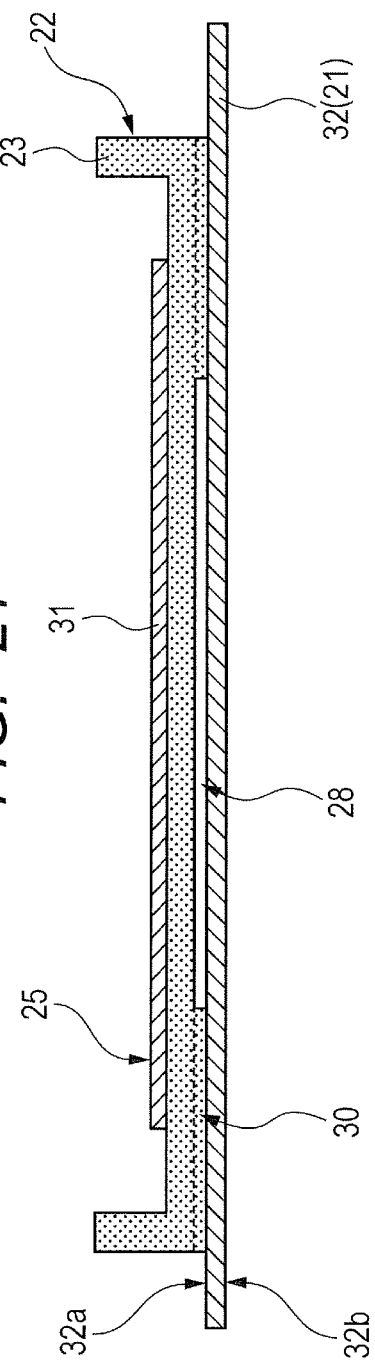

METHOD OF MANUFACTURING SEMICONDUCTOR DEVICE

CROSS-REFERENCE TO RELATED APPLICATIONS

The disclosure of Japanese Patent Application No. 2011-230673 filed on Oct. 20, 2011 including the specification, drawings and abstract is incorporated herein by reference in its entirety.

BACKGROUND

The present invention relates to technology for improving reliability in a method of manufacturing a semiconductor device (or semiconductor integrated circuit).

Japanese Unexamined Patent Publication No. Hei 6 (1994)-174786 discloses a burn-in board with a grid conductor pattern in a test control circuit.

Japanese Unexamined Patent Publication No. Hei 10 (1998)-242608 discloses a four-layer wiring burn-in board in which two inner layers with blanket-type conductor patterns correspond to a power supply layer and a grounding layer.

Japanese Unexamined Patent Publication No. 2004-172647 and its equivalent U.S. Pat. No. 7,015,069 disclose a mesh conductor pattern as a pattern to reinforce a wiring substrate for the manufacture of FBGA (Fine-pitch Ball Grid Array).

SUMMARY

A burn-in process, in which in a high temperature environment, current and voltage are applied to a device to be tested, is one of aging processes for finished semiconductor devices (semiconductor packages). The burn-in process uses a burn-in board in which a socket for housing a semiconductor device is provided in a wiring substrate. A main purpose of the burn-in process is to promote the manifestation of a potential initial failure by imposing environmental stress (electrical stress beyond the rating in some cases), including high temperature, on the device to be tested while applying voltage and current to it. Therefore, the burn-in board has a plurality of wires for signals which are electrically coupled with a plurality of terminals in the socket. Generally the burn-in process takes a long time, so during this process, general electrical tests (wafer probe test, package test, etc.) may be performed, which is called "test burn-in."

In order to increase the supply voltage and reference voltage for the burn-in board and reduce noise, the present inventors considered an approach that signal wires are disposed in inner layers among the plural wiring layers of the burn-in board and wiring for supply voltage or reference voltage as a blanket-type conductor pattern (extensive wiring or solid conductor pattern) is disposed in an outermost layer whenever possible.

However, the degree of adhesion between the metal wiring (solid wiring pattern) and an insulating protective film formed over the wiring for protection of the wiring (insulating film or solder resist film) is low and it has been found that when a thermal cycle (for example, high temperature to normal temperature) is repeated, the protective film peels.

If the protective film peels, not only it may scatter as a foreign substance but also the foreign substance may adhere to the inside of the socket and the device being tested is judged as defective in an electrical test (package test or burn-in monitoring). Also it may be impossible to carry out the burn-in process properly.

The present invention has been made in order to solve this problem.

An object of the present invention is to provide a reliable process for manufacturing a semiconductor device.

The above and further objects and novel features of the invention will more fully appear from the following detailed description in this specification and the accompanying drawings.

A major aspect of the present invention which will be disclosed herein is briefly outlined below.

According to one major aspect of the present invention, when the burn-in process is performed on a semiconductor device during a manufacturing process, power supply/grounding wiring which has microscopic openings formed at least almost all over the areas around sockets is provided over the front or back surface of an organic multilayer wiring substrate which is the body of a burn-in board.

The advantageous effect brought about by the major aspect of the present invention disclosed herein is briefly outlined below.

When the burn-in process is performed on a semiconductor device during a manufacturing process, power supply/grounding wiring which has microscopic openings formed at least almost all over the areas around sockets is provided over the front or back surface of the organic multilayer wiring substrate which is the body of the burn-in board, so the possibility of peeling of solder resist on the organic multilayer wiring substrate is reduced.

BRIEF DESCRIPTION OF THE DRAWINGS

FIG. 20 is a schematic sectional view taken along the line X-X' of FIG. 18;

FIG. 21 is a schematic sectional view taken along the line P-P' of FIG. 18;

DETAILED DESCRIPTION

Overview of the Embodiments

Figure 1:
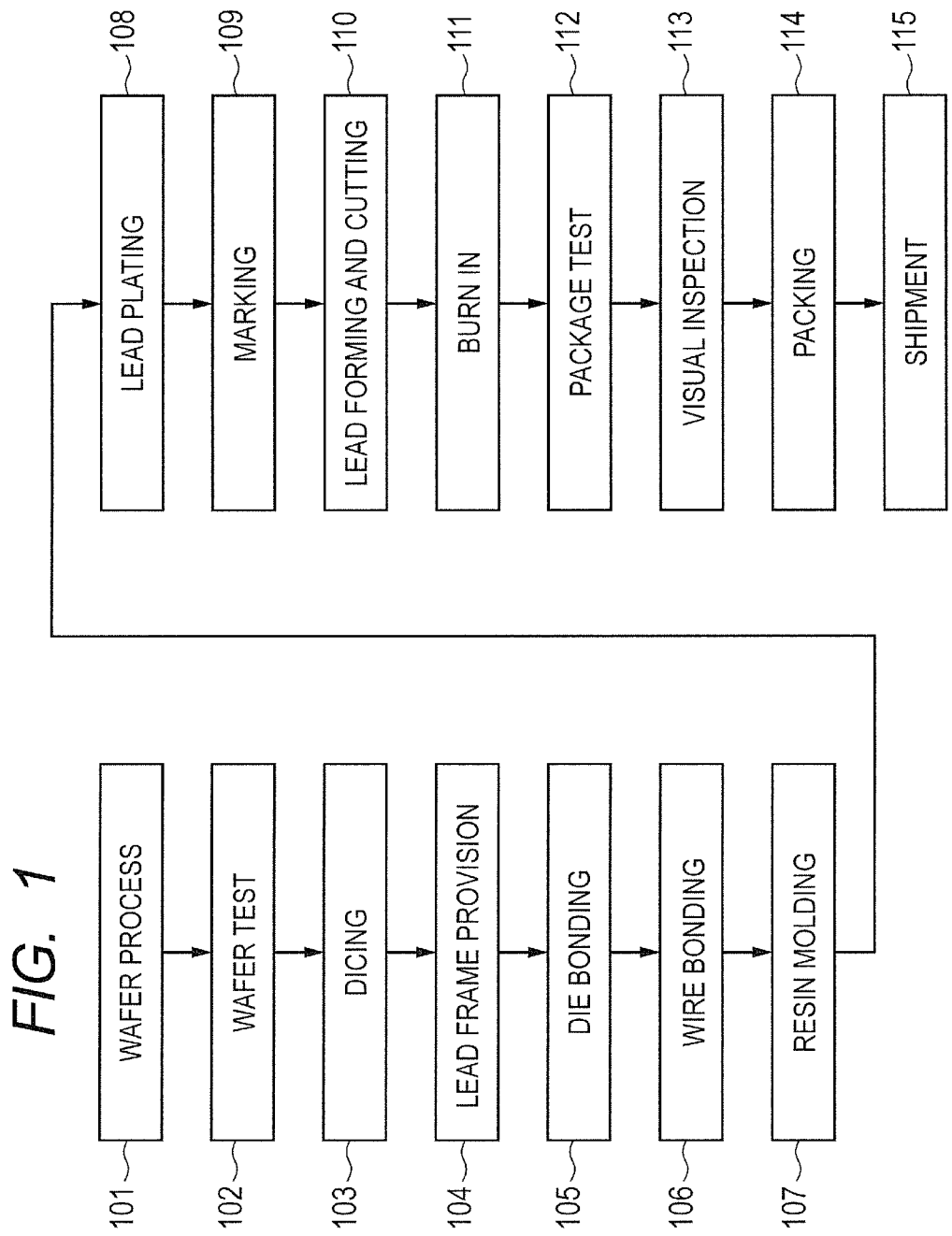
FIG. 1 is a flowchart summarizing the manufacturing process of a method of manufacturing a semiconductor device according to an embodiment of the present invention.

First, the preferred embodiments disclosed herein are summarized below.

1. A method of manufacturing a semiconductor device includes the following steps: (a) providing a plurality of semiconductor chips in which devices are formed; (b) assembling the plurality of semiconductor devices by forming an external terminal to be electrically connected with each of the semiconductor chips; (c) providing a burn-in board including a plurality of sockets over a front surface thereof; and (d) performing a burn-in process on the semiconductor devices in such a state of loading the semiconductor devices in the sockets, respectively. Here the burn-in board further includes: (x1) an organic multilayer wiring substrate including an internal signal wiring layer, a front side outermost power supply/grounding wiring layer, and a back side outermost power supply/grounding wiring layer: (x2) a back side power supply/grounding wiring which covers almost all portions of the back surface of the organic multilayer wiring substrate and belongs to the back side outermost power supply/grounding wiring layer; (x3) front side power supply/grounding wiring which covers almost all portions of the front surface of the organic multilayer wiring substrate where the sockets are not provided, and which belongs to the front side outermost power supply/grounding wiring layer; (x4) a solder resist film which covers almost all the front and back surfaces of the organic multilayer wiring substrate; and (x5) a plurality of microscopic openings formed almost all over the front side power supply/grounding wiring and the back side power supply/grounding wiring.

2. In the method of manufacturing a semiconductor device as described above in 1, the sockets each include: (y1) a frame-shaped protrusion provided in the center of each peripheral edge on the back surface and (y2) a corner support portion which is provided in each corner of the back surface and protrudes to the same extent as the frame-shaped protrusion.

3. In the method of manufacturing a semiconductor device as described above in 2, the front side power supply/grounding wiring lies over the front surface of the organic multilayer wiring substrate under each of the corner support portions.

4. In the method of manufacturing a semiconductor device as described above in 3, the microscopic openings are formed all over the front side power supply/grounding wiring on the front surface of the organic multilayer wiring substrate under each of the corner support portions.

5. In the method of manufacturing a semiconductor device as described above in 3, the microscopic openings are not provided over the front side power supply/grounding wiring on the front surface of the organic multilayer wiring substrate under each of the corner support portions.

6. In the method of manufacturing a semiconductor device as described above in any of 1 to 5, each of the semiconductor devices is a resin-sealed semiconductor device and the external terminals are leads.

7. In the method of manufacturing a semiconductor device as described above in any of 1 to 6, processing temperature of the burn-in process is about 125 degrees Celsius.

8. In the method of manufacturing a semiconductor device as described above in any of 1 to 7, the front side power supply/grounding wiring is one of power supply wiring and grounding wiring and the back side power supply/grounding wiring is the other of the power supply wiring and the grounding wiring.

9. In the method of manufacturing a semiconductor device as described above in any of 1 to 8, the burn-in process is performed with contact electrodes of the sockets in contact with the external terminals of the semiconductor devices.

10. In the method of manufacturing a semiconductor device as described above in any of 2 to 5, the front side power supply/grounding wiring does not lie over the front surface of the organic multilayer wiring substrate in an area near an outside of the frame-shaped protrusion of each of the plurality of sockets.

11. In the method of manufacturing a semiconductor device as described above in any of 1 to 10, the aperture ratios of the front side power supply/grounding wiring and the back side power supply/grounding wiring are not less than 15% and not more than 35%.

12. In the method of manufacturing a semiconductor device as described above in any of 1 to 11, the front side power supply/grounding wiring is grounding wiring.

13. A method of manufacturing a semiconductor device includes the following steps: (a) providing a plurality of semiconductor chips in which devices are formed; (b) assembling the plurality of semiconductor devices by forming an external terminal to be electrically connected with each of the semiconductor chips; (c) providing a burn-in board having a plurality of sockets over a front surface thereof; and (d) performing a burn-in process on the semiconductor devices with the semiconductor devices loaded in the sockets respectively. Here the burn-in board further includes: (x1) an organic multilayer wiring substrate including an internal signal wiring layer, a front side outermost power supply/grounding wiring layer, and a back side outermost power supply/grounding wiring layer; (x2) a front side power supply/grounding wiring which covers almost all front surface of the organic multilayer wiring substrate where the sockets are not provided, and which belongs to the front side outermost power supply/grounding wiring layer; (x3) a solder resist film which covers almost all the front surface of the organic multilayer wiring substrate; and (x4) microscopic openings formed almost all over the front side power supply/grounding wiring.

14. In the method of manufacturing a semiconductor device as described above in 13, the sockets each include: (y1) a frame-shaped protrusion provided in the center of each peripheral edge on a back surface and (y2) a corner support portion which is provided in each corner of the back surface and protrudes to the same extent as the frame-shaped protrusion.

15. In the method of manufacturing a semiconductor device as described above in 14, the front side power supply/grounding wiring lies over the front surface of the organic multilayer wiring substrate under each of the corner support portions.

16. In the method of manufacturing a semiconductor device as described above in 15, the microscopic openings are formed all over the front side power supply/grounding wiring on the front surface of the organic multilayer wiring substrate under each of the corner support portions.

17. In the method of manufacturing a semiconductor device as described above in 15, the microscopic openings are not provided over the front side power supply/grounding wiring on the front surface of the organic multilayer wiring substrate under each of the corner support portions.

18. In the method of manufacturing a semiconductor device as described above in any of 13 to 17, each of the semiconductor devices is a resin-sealed semiconductor device and the external terminals are leads.

19. In the method of manufacturing a semiconductor device as described above in any of 13 to 18, the aperture ratio of the front side power supply/grounding wiring is not less than 15% and not more than 35%.

20. In the method of manufacturing a semiconductor device as described above in any of 13 to 19, the front side power supply/grounding wiring is grounding wiring.

21. In the method of manufacturing a semiconductor device as described above in any of 13 to 20, the processing temperature of the burn-in process is about 125 degrees Celsius.

22. In the method of manufacturing a semiconductor device as described above in any of 13 to 21, the burn-in process is performed with contact electrodes of the sockets in contact with the external terminals of the semiconductor devices.

23. In the method of manufacturing a semiconductor device as described above in any of 14 to 22, the front side power supply/grounding wiring does not lie over the front surface of the organic multilayer wiring substrate in an area near an outside of the frame-shaped protrusion of each of the plurality of sockets.

Rules of Description in the Specification

1. The preferred embodiments of the present invention may be described separately in different sections as necessary, but such descriptions are not irrelevant to each other unless otherwise specified. One description may be, in part, a detailed form of another or one description may be, in whole or in part, a variation of another. Basically, the same explanations are not repeated. In the preferred embodiments, even when a specific numerical value is indicated for an element, the numerical value is not essential for the element unless otherwise specified or unless theoretically limited to the numerical value or obviously so in the context.

Here the term "semiconductor device" or "semiconductor integrated circuit device" primarily refers to various discrete transistors (active devices) or semiconductor chips or the like (for example, single-crystal silicon substrates) on which resistors and capacitors are integrated with such transistors. Concretely, typical examples are resin-sealed devices having leads and one or more than one semiconductor chip and other examples are devices having bump electrodes such as BGA (Ball Grid Array) devices, WLP (Wafer Level Package) devices, and flip-chip bare chips.

Among typical such transistors are MISFETs (Metal Insulator Semiconductor Field Effect Transistors) as typified by MOSFETs (Metal Oxide Semiconductor Field Effect Transistors). Typical examples of integrated circuits are CMIS (Complementary Metal Insulator Semiconductor) integrated circuits as typified by CMOS (Complementary Metal Oxide Semiconductor) integrated circuits.

2. In the description of a material or composition in an embodiment of the invention, the expression "X which comprises A" or "X which includes A" does not exclude a main component other than A unless otherwise specified or unless another component is obviously excluded in the context. If the expression concerns a component, it means "X which includes A as a main component." For example, the term "silicon member" represents not only a member made of pure silicon but also a member made of SiGe alloy or another type of multi-component alloy which contains silicon as a main component and may include another additive.

3. Similarly, although preferred examples of figures, positions, and attributes are shown here, it is needless to say that they are not strictly limited to these examples unless otherwise specified or unless obviously limited so in the context.

4. Also, even when a specific numerical value or quantity is indicated herein, it is not limited to the specific numerical value or quantity unless otherwise specified or unless theoretically limited to it or obviously so in the context; it may be larger or smaller than the specific numerical value or quantity.

5. The term "wafer" generally refers to a single-crystal silicon wafer on which a semiconductor device (including a semiconductor integrated circuit device or electronic device) is formed. However, obviously it is also interpreted to include an epitaxial wafer and a wafer which combines an insulating substrate, such as an SOI substrate or LCD glass substrate, with semiconductor layers.

6. The terms "burn-in process," "burn-in test," and "burn-in" are used herein in almost the same meaning as aging treatment. Specifically, burn-in is a process in which the device to be tested is forced to operate under various types of stress for a relatively long time (for example, several hours) to shift the device's time axis to the future. The various types of stress include high temperature environment (for example, about 125 degrees Celsius, or temperature higher than room temperature), low temperature environment (for example, about minus 40 degrees Celsius), high humidity environment, and voltage or current higher than normal.

This process is intended to accelerate the manifestation of a potential initial failure (acceleration effect) and a tested device in which a failure has been manifested is judged as defective and excluded in monitoring during the burn-in process or a subsequent final test (package test, screening test), etc. In addition, while the burn-in process is underway, another test for a specific item may be conducted. This test is called test burn-in. Substantially, test burn-in may be considered to be part of monitoring in the burn-in process.

7. The expression "almost all over" here means "whole surface except portions which are "technically difficult to cover or exceptionally excluded for other reasons," particularly when it is used in reference to "the organic multilayer wiring substrate," "back side power supply/grounding wiring," "front side power supply/grounding wiring," "solder resist film," "microscopic openings" and so on.

Here, the term "power supply/grounding wiring" in "back side power supply/grounding wiring," "front side power supply/grounding wiring" and so on means power supply wiring or grounding wiring.

As for "back side power supply/grounding wiring," "front side power supply/grounding wiring" and so on, "opening ratio" is the total area of microscopic openings divided by the sum of the area of a metal film forming the back side power supply/grounding wiring or front side power supply/grounding wiring" and the total area of microscopic openings, as expressed in percentage.

As for "back side power supply/grounding wiring," "front side power supply/grounding wiring" and so on, "minute" in "microscopic opening" implies, for example, that the typical smallest dimension of microscopic openings as seen in a two-dimensional diagram (for example, length of the short side of a rectangular slit as an opening) or the smallest half pitch in an array of microscopic openings (for example, the smaller half pitch if the pitches in directions orthogonal to each other are different) is small enough as compared with the length of one side of a socket.

8. The term "extensive wiring" used herein, which refers to wiring covering, for example, most of the front or back surface of a burn-in board, means wiring which covers a sufficiently wider area than an ordinary land or signal wiring microscopically uniformly (uniformly in a scale sufficiently larger than microscopic openings). Usually, extensive wiring is grounding wiring or power supply wiring.

The simple term "extensive wiring" is meant to include both "mesh extensive wiring" (oepning-formed conductor pattern) in which microscopic openings are formed almost uniformly or formed all over, and "solid extensive wiring" (blanket type conductor pattern).

Details of the Embodiments

Next, the preferred embodiments of the present invention will be described in further detail. In the drawings, the same or similar elements are designated by the same or similar reference symbols or numerals. Basically the same explanations will not be repeated.

As for the accompanying drawings, hatching, etc. may be omitted even for a cross section if hatching, etc. may cause the illustration to look complicated or it is easy to distinguish the cross section from space. In this connection, a background contour line may be omitted even for a hole closed in a plan view when apparent from an explanation. Furthermore, even an area which is not a cross section may be marked with hatching in order to clarify that it is not space.

1. Explanation of Main Processes Preceding a Burn-in Process in a Method of Manufacturing a Semiconductor Device According to an Embodiment of the Present Invention (See FIGS. 1 to 7 and Related Figures)

The present invention will be described concretely below on the assumption that the device to be tested is a non-memory semiconductor device such as a logic semiconductor integrated circuit device, SOC (System on Chip) semiconductor integrated circuit device, or microcomputer semiconductor integrated circuit device. However, it is needless to say that each embodiment of the present invention can be applied to memory semiconductor devices.

As for the package type, an individually resin-sealed package which uses a lead frame will be explained below. However, it is needless to say that the package may be in another form such as a MAP (Mold Array Package), BGA package with bump electrodes, WLP package or bare chip.

Figure 2:
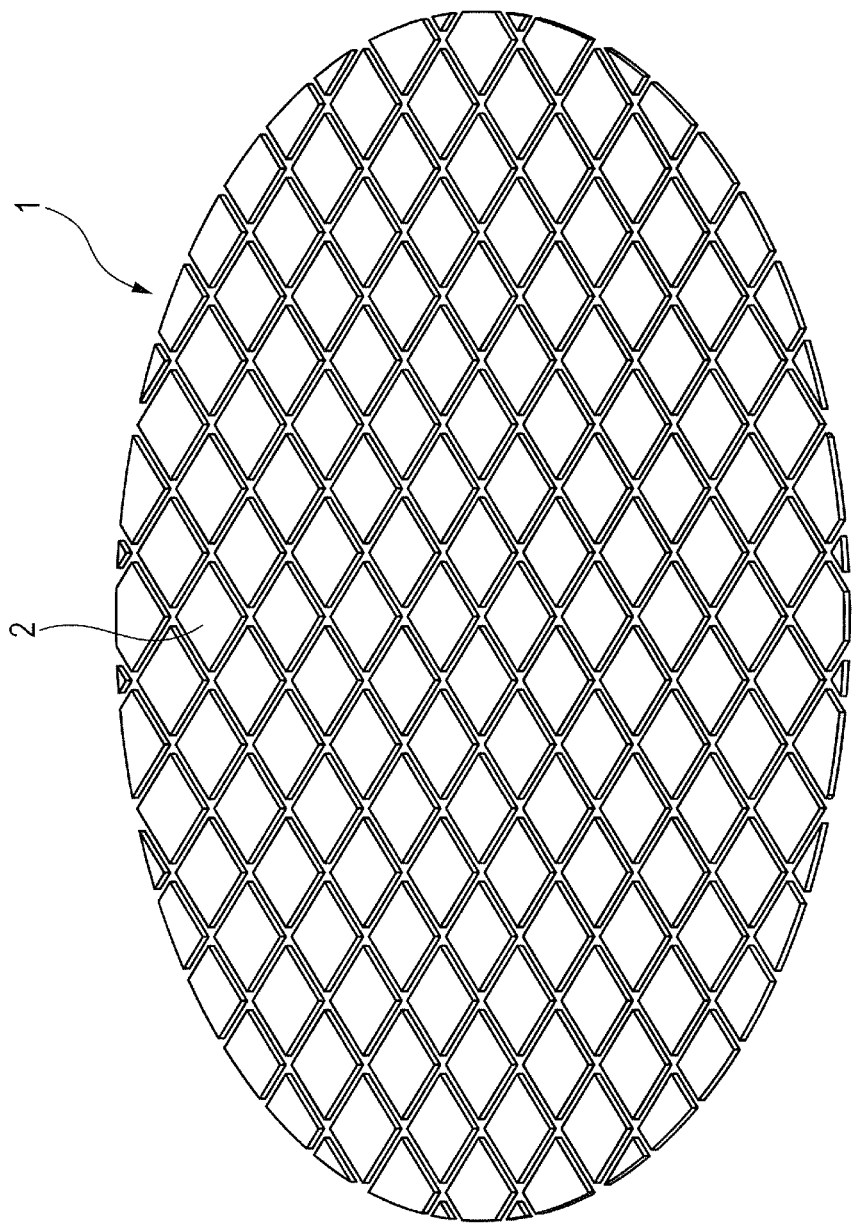
FIG. 2 is a perspective view showing the external appearance of a semiconductor wafer in the manufacturing process (at the time of completion of a wafer process) of the method of manufacturing a semiconductor device according to the embodiment of the present invention.
Figure 3:
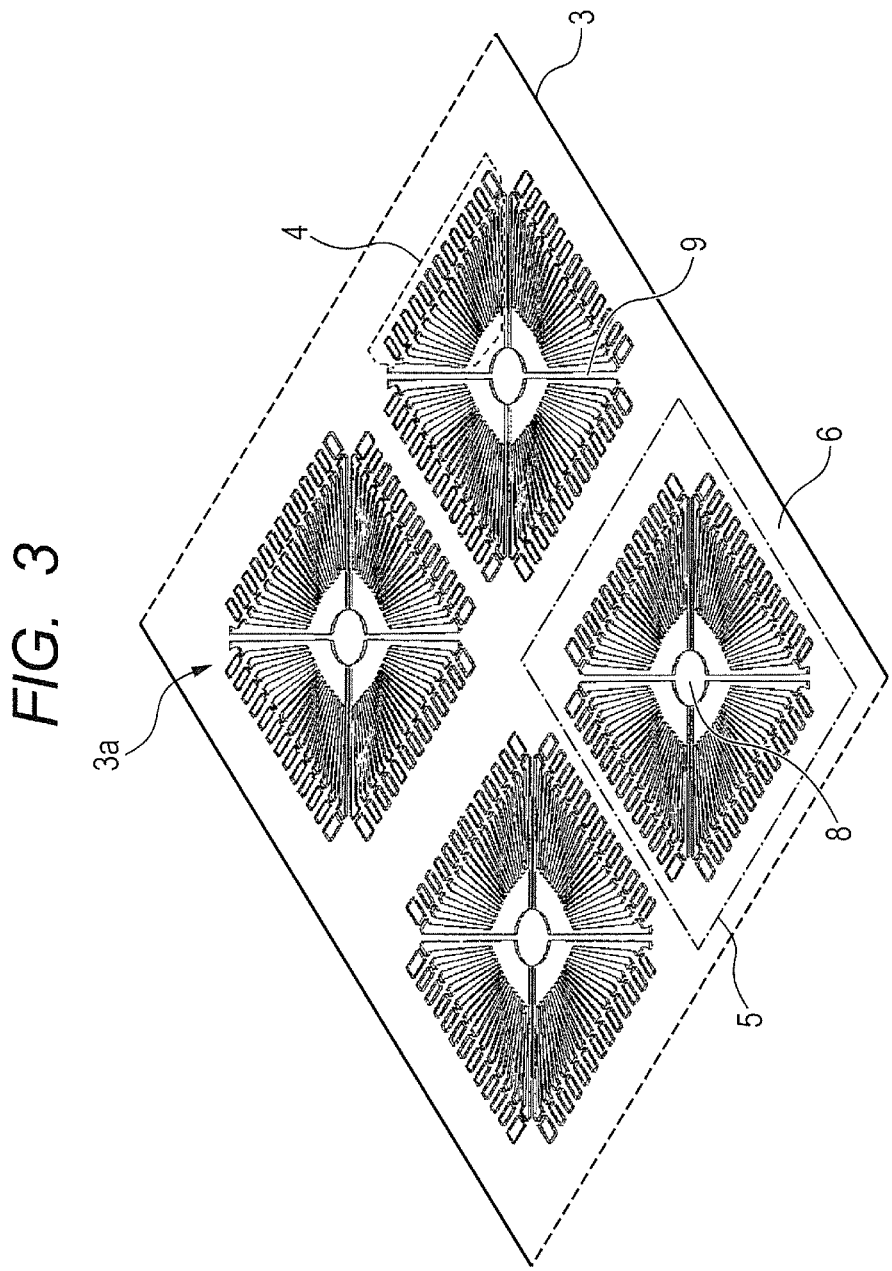
FIG. 3 is a perspective view showing the external appearance of a lead frame, etc. in the manufacturing process (at the time of completion of a lead frame provision step) of the method of manufacturing a semiconductor device according to the embodiment of the present invention.
Figure 4:
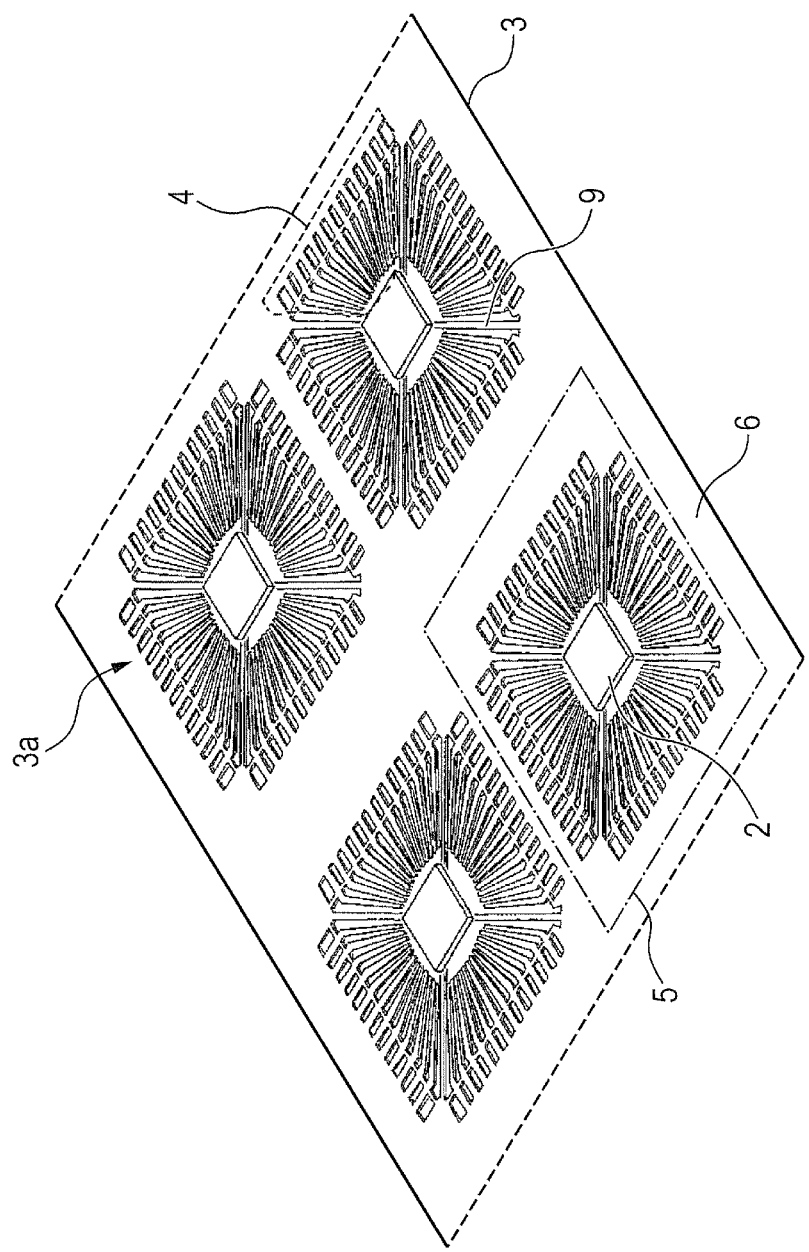
FIG. 4 is a perspective view showing the external appearance of a lead frame, etc. in the manufacturing process (at the time of completion of a die bonding step) of the method of manufacturing a semiconductor device according to the embodiment of the present invention.
Figure 5:
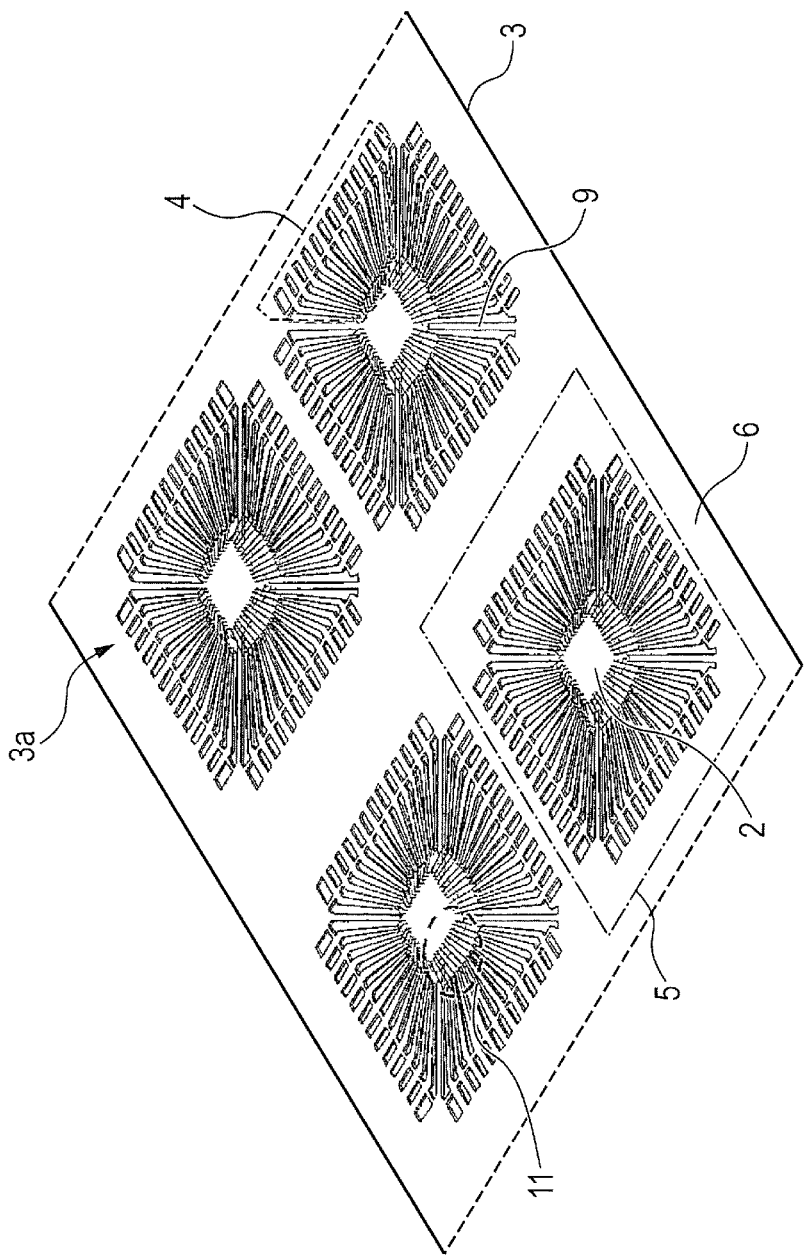
FIG. 5 is a perspective view showing the external appearance of a lead frame, etc. in the manufacturing process (at the time of completion of a wire bonding step) of the method of manufacturing a semiconductor device according to the embodiment of the present invention.
Figure 6:
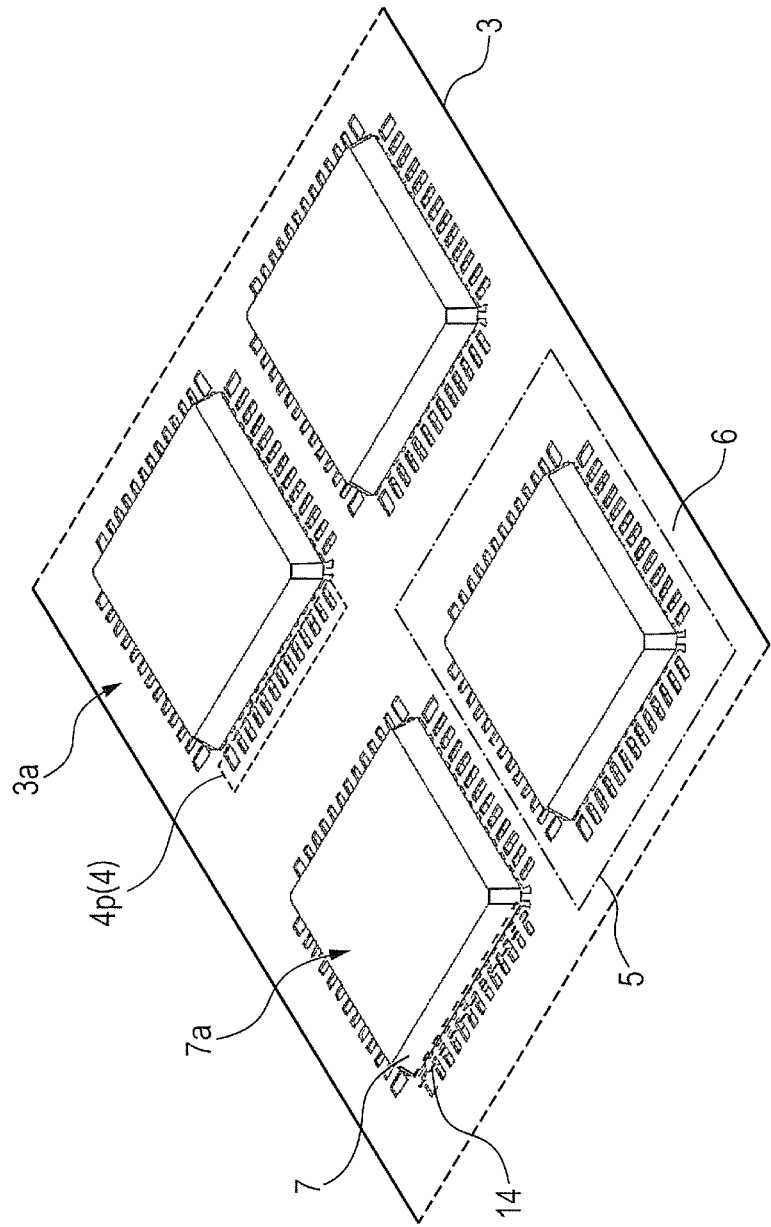
FIG. 6 is a perspective view showing the external appearance of a lead frame, etc. in the manufacturing process (at the time of completion of a resin sealing step) of the method of manufacturing a semiconductor device according to the embodiment of the present invention.
Figure 7:
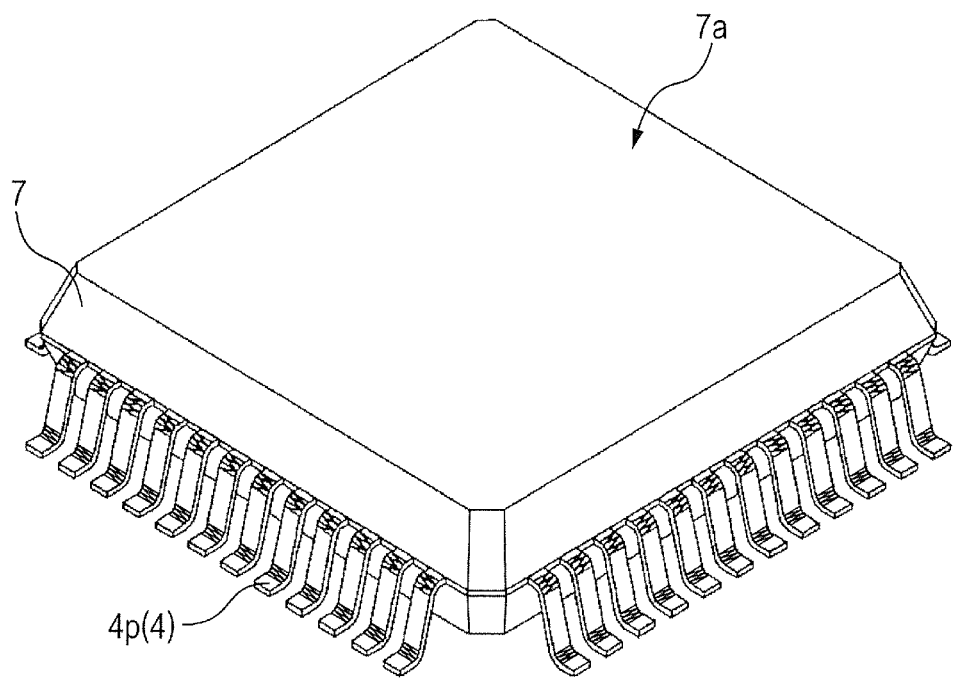
FIG. 7 is a perspective view showing the external appearance of a package in the manufacturing process (at the time of completion of a packaging step) of the method of manufacturing a semiconductor device according to the embodiment of the present invention.

FIG. 1 is a process block flowchart summarizing the manufacturing process of a method of manufacturing a semiconductor device according to an embodiment of the present invention. FIG. 2 is a perspective view showing the external appearance of a semiconductor wafer in the manufacturing process (at the time of completion of the wafer process) of the method of manufacturing a semiconductor device according to the embodiment of the present invention. FIG. 3 is a perspective view showing the external appearance of a lead frame, etc. in the manufacturing process (at the time of completion of the lead frame provision step) of the method of manufacturing a semiconductor device according to the embodiment of the present invention. FIG. 4 is a perspective view showing the external appearance of a lead frame, etc. in the manufacturing process (at the time of completion of the die bonding step) of the method of manufacturing a semiconductor device according to the embodiment of the present invention. FIG. 5 is a perspective view showing the external appearance of a lead frame, etc. in the manufacturing process (at the time of completion of the wire bonding step) of the method of manufacturing a semiconductor device according to the embodiment of the present invention. FIG. 6 is a perspective view showing the external appearance of a lead frame, etc. in the manufacturing process (at the time of completion of the resin sealing step) of the method of manufacturing a semiconductor device according to the embodiment of the present invention. FIG. 7 is a perspective view showing the external appearance of a package in the manufacturing process (at the time of completion of the packaging step) of the method of manufacturing a semiconductor device according to the embodiment of the present invention. Referring to these figures, the main processes preceding the burn-in process in the method of manufacturing a semiconductor device according to the embodiment of the present invention will be explained below.

As shown in FIGS. 1 and 2, a wafer probe test 102 is performed on wafer 1 in which a device is formed in each chip region 2 (chip 2 after dicing), namely wafer 1 which has been subjected to the wafer process 101. Then, back grinding is done on the wafer subjected to the wafer test step 102 as necessary so that the wafer thickness is decreased, for example, from a range of 700-1000 micrometers to a desired range (10-300 micrometers). Then, the wafer 1 is divided into individual chips (semiconductor chips) by dicing or a similar process (dicing step 103 in FIG. 1).

As shown in FIG. 3, a lead frame 3 is provided (lead frame provision step 104 in FIG. 1). As can be understood from the figure, a plurality of unit device regions 5 are held together by the frame portion 6 of the lead frame 3 (the front side shown in the figure is a chip mounting surface 3*a*) with a die pad 8 placed in the center of each unit device region 5. This die pad 8 is coupled to the frame portion 6 in the periphery through a die pad support bar 9 (die pad suspension lead) and leads 4 are disposed around the die pad 8.

Next, in a die bonding apparatus, as shown in FIG. 4, a semiconductor chip 2 is fixed (or mounted) over each die pad 8 through an adhesive agent layer or the like (die bonding step 105 in FIG. 1). Specifically, the back surface of the semiconductor chip 2 is bonded to the die pad 8 through the adhesive agent layer or the like. Then, the lead frame 3 is transferred from the die bonding apparatus to a wire bonding apparatus.

Next, in the wire bonding apparatus, as shown in FIG. 5, a plurality of electrode pads (bonding pads) formed on the front or main surface of the semiconductor chip 2 (electrode pad formation side) and a plurality of leads 4 outside the semiconductor chip 2 (more specifically, inner leads) are interconnected by bonding wires 11 (wire bonding step 106 in FIG. 1).

Next, as shown in FIG. 6, the lead frame 3 is transferred to a molding apparatus, in which, for example, each unit device region 5 is resin-sealed by transfer molding or a similar process (resin molding step 107 in FIG. 1). As can be understood from the figure, at this time a plurality of leads 4 are interconnected by tie bars 14 (dam bars) in the vicinity of the coupling between the inner lead portion and outer lead portion 4*p*. Then, the lead frame 3 is unloaded from the molding apparatus and subjected to post-curing (complete curing process), for example, about 175 degrees Celsius for several hours before the outer lead portion 4*p* is plated with solder or the like (lead plating step 108 in FIG. 1). Then, the lead frame 3 is transferred to a tie bar cutting apparatus. Then, the tie bars 14 (dam bars) are cut in the tie bar cutting apparatus. Then, the lead frame 3 is transferred from the tie bar cutting apparatus, for example, to a marking apparatus.

Next, in the marking apparatus, marking is done on the upper surface 7*a* of a resin sealing body 7 (marking step 109). Then, the lead frame 3 is transferred from the marking apparatus, for example to a lead forming and cutting apparatus. Then, in the lead forming and cutting apparatus, the outer lead portion 4*p* of each unit device region 5 is formed and separated from the lead frame 3 (lead forming and cutting step 110 in FIG. 1) and as a consequence, individual semiconductor devices 7 (semiconductor packages) are obtained.

2. Explanation of a Burn-in Board Structure for Use in the Burn-in Process of the Semiconductor Manufacturing Method According to the Embodiment of the Present Invention (See FIGS. 8 to 17 and Related Figures)

Next, an organic multilayer wiring substrate as the burn-in board body will be described concretely by taking a four-layer interconnection substrate as an example. However, it is also acceptable that the organic multilayer wiring substrate is a two-layer or three-layer interconnection substrate or an interconnection substrate with five or more layers.

An explanation will be given below by taking as an example a burn-in board which has grounding wiring in the form of mesh extensive wiring on the upper surface (surface where sockets are located) and power supply wiring in the form of mesh extensive wiring on the lower surface. However, it is also acceptable that grounding wiring in the form of mesh extensive wiring lies on both the upper and lower surfaces or power supply wiring in the form of mesh extensive wiring lies on both the upper and lower surfaces.

An explanation will be given below of a concrete example of an organic multilayer wiring substrate in which extensive power supply/grounding wiring lies in both the uppermost and lowermost wiring layers or grounding wiring or power supply wiring lies in a way to cover almost the whole surfaces of the layers. However, it is also acceptable that the substrate has extensive grounding wiring (generally, extensive power supply/grounding wiring) only on the upper surface (side where sockets are located) as far as there is no problem with noise or need for increasing the power supply. Similarly, it is also acceptable that the substrate has extensive grounding wiring (generally, extensive power supply/grounding wring) only on the lower surface.

Furthermore, an explanation will be given below of a case that extensive power supply/grounding wiring, etc. extends on the upper surface of the organic multilayer wiring substrate under the corner support portions. However, it is needless to say that it is not essential to provide extensive power supply/grounding wiring there.

As for the number of sockets on the burn-in board, a relatively small number of sockets are shown here for simple illustration though actually a larger number of sockets are provided in order to decrease the processing time per device to be tested.

Figure 8:
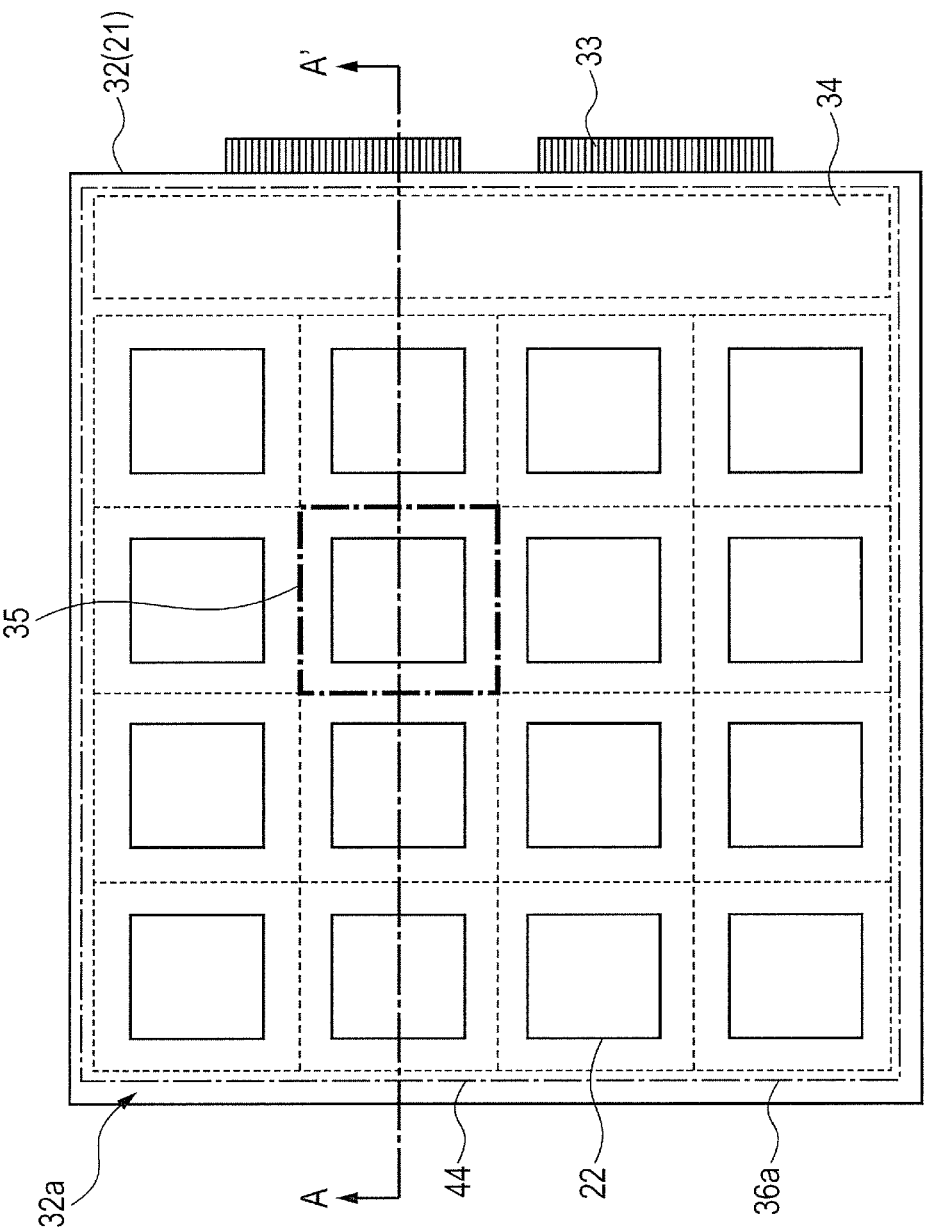
FIG. 8 is a top view of the burn-in board which illustrates the burn-in board structure, etc. used in the burn-in process of the method of manufacturing a semiconductor device according to the embodiment of the present invention.
Figure 9:
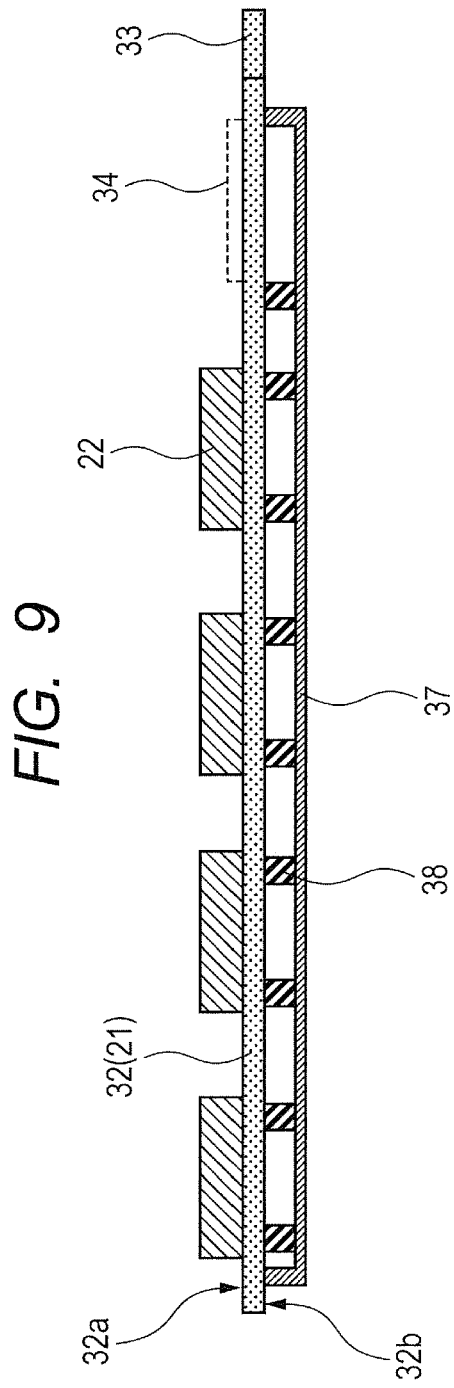
FIG. 9 is a schematic sectional view taken along the line A-A' of FIG. 8.
Figure 10:
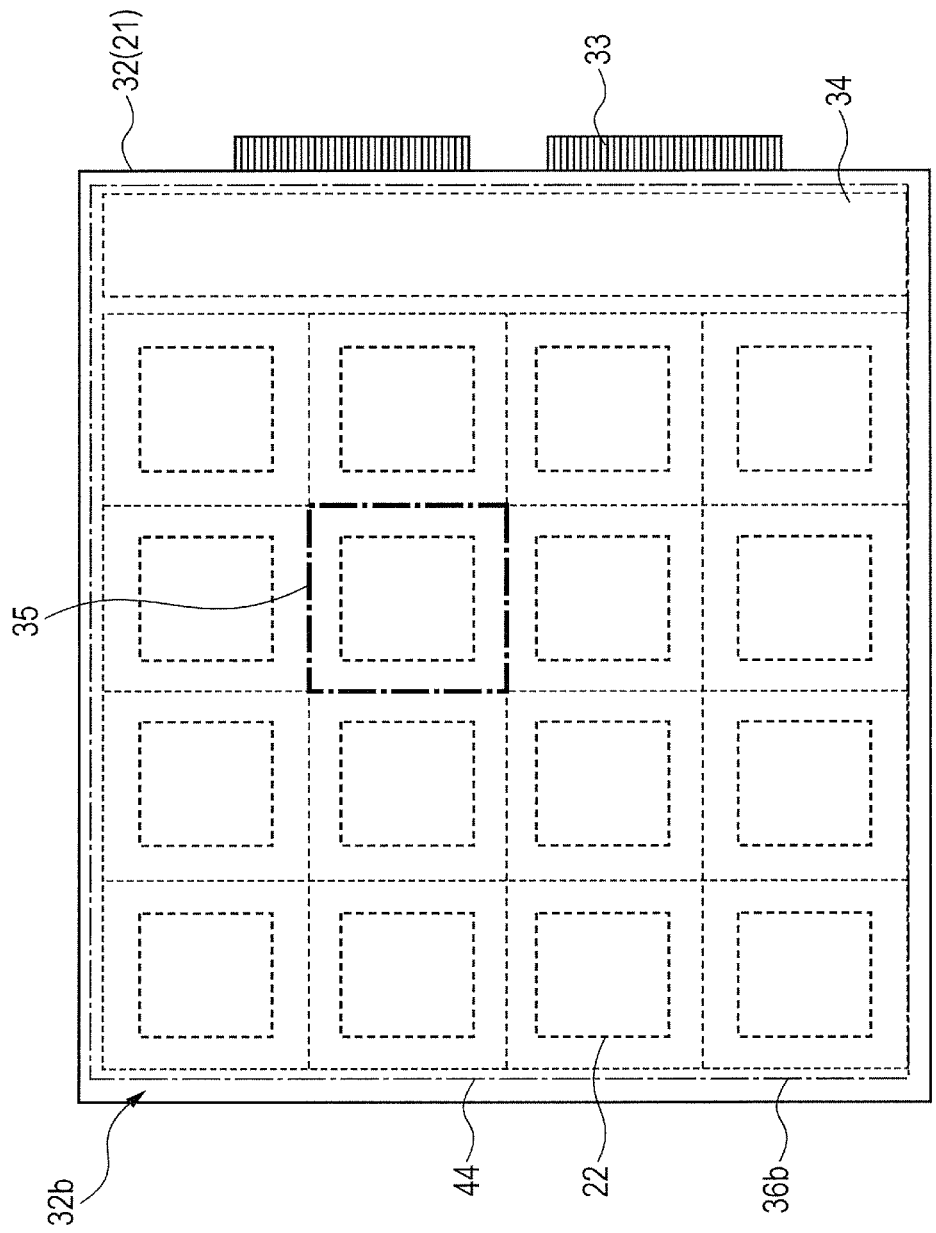
FIG. 10 is a bottom view of the burn-in board which illustrates the burn-in board structure, etc. used in the burn-in process of the method of manufacturing a semiconductor device according to the embodiment of the present invention.
Figure 11:
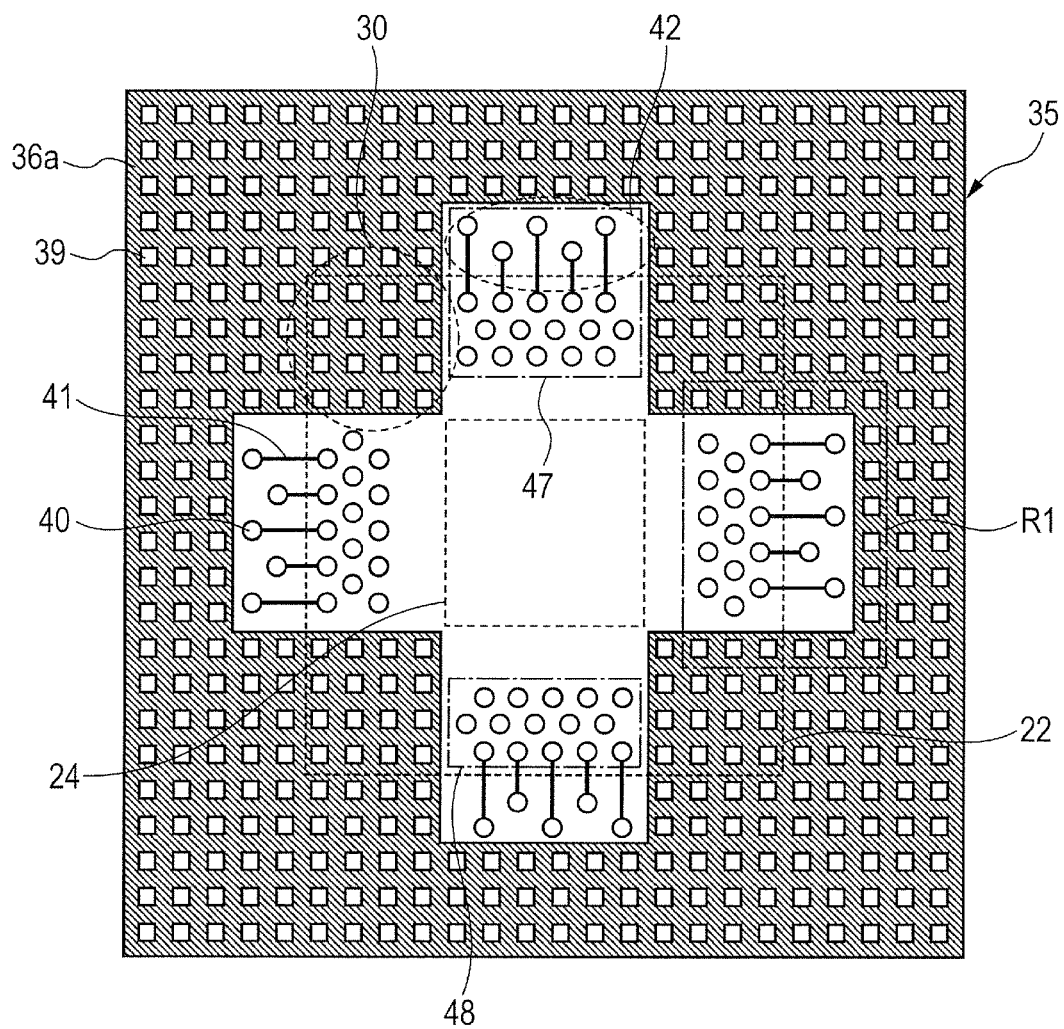
FIG. 11 is an enlarged top view of a unit socket and surrounding region shown in FIG. 8.
Figure 12:
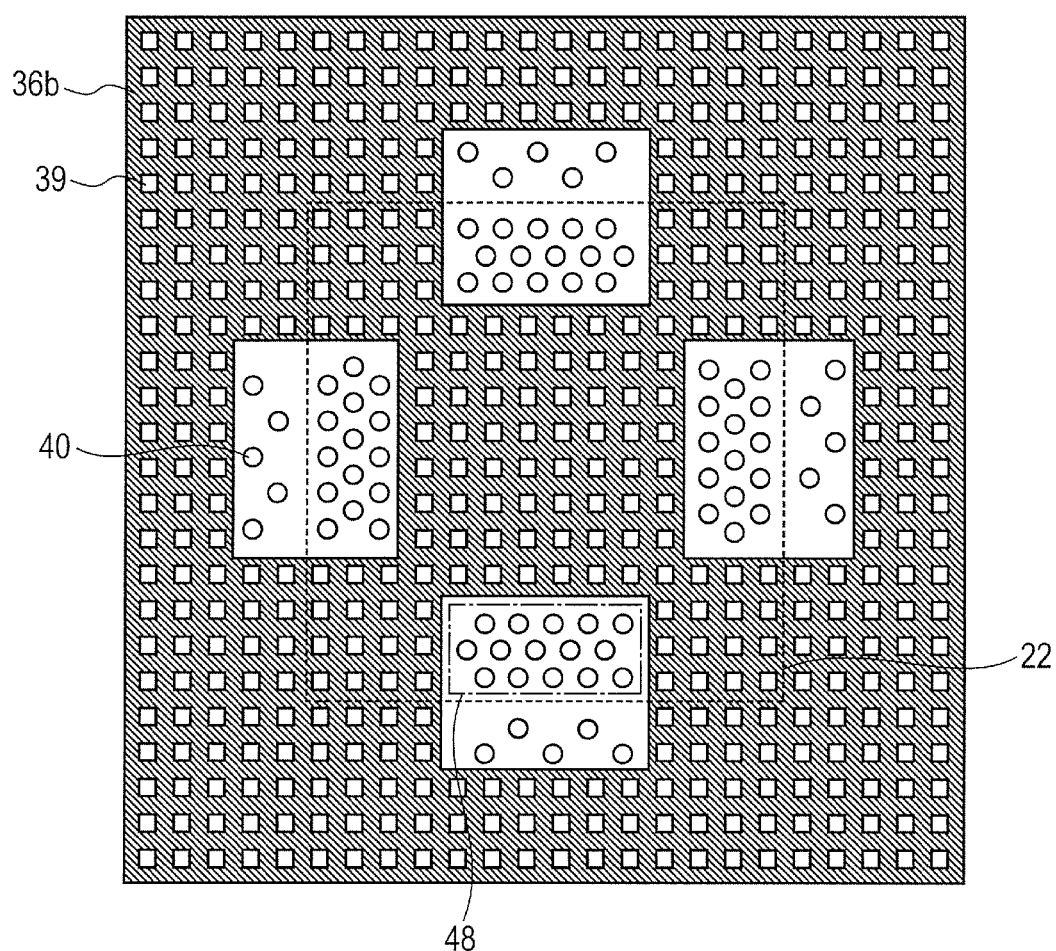
FIG. 12 is an enlarged bottom view of the unit socket and surrounding region shown in FIG. 10.
Figure 13:
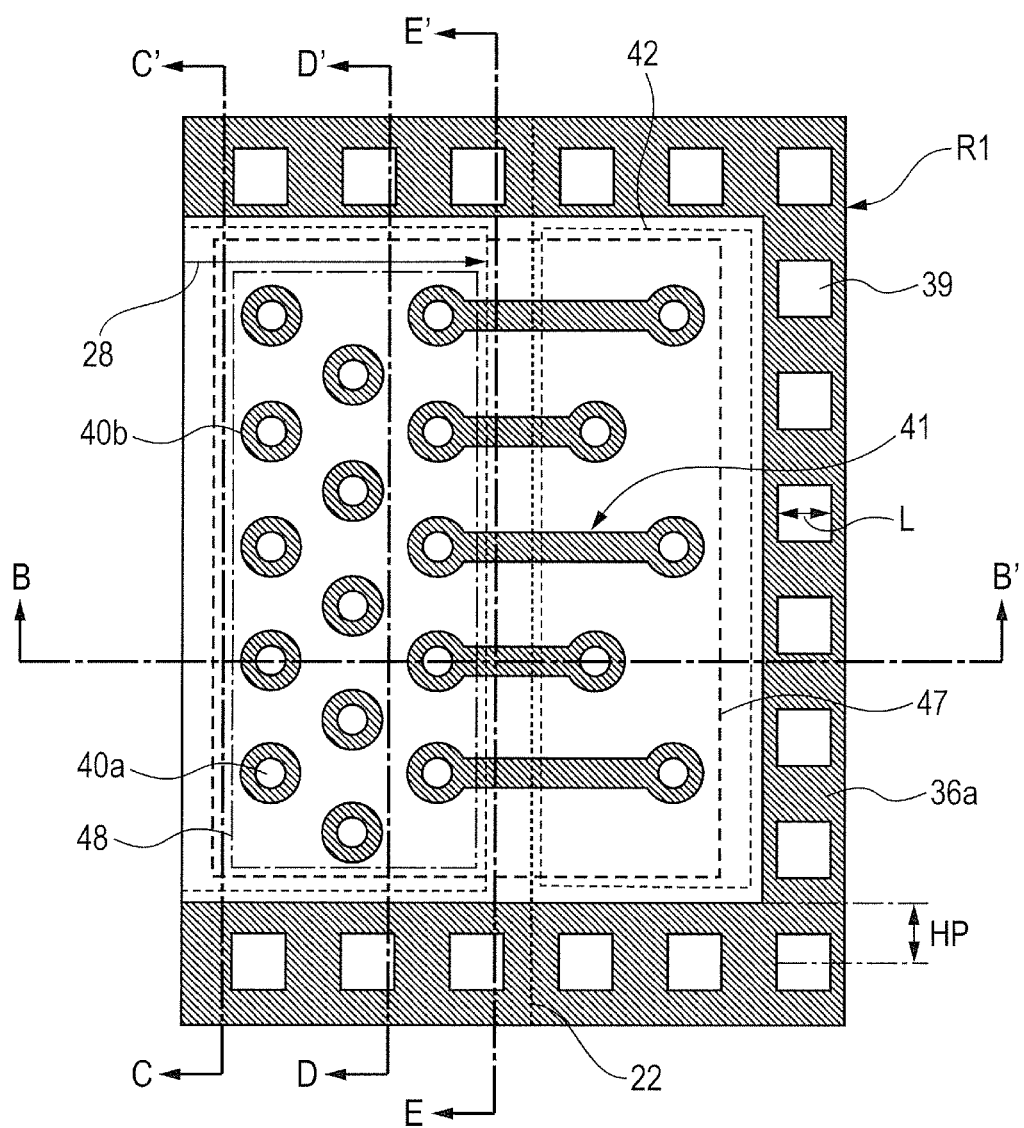
FIG. 13 is an enlarged top view of a peripheral cutout region R1 of the upper outer frame as shown in FIG. 11.
Figure 14:
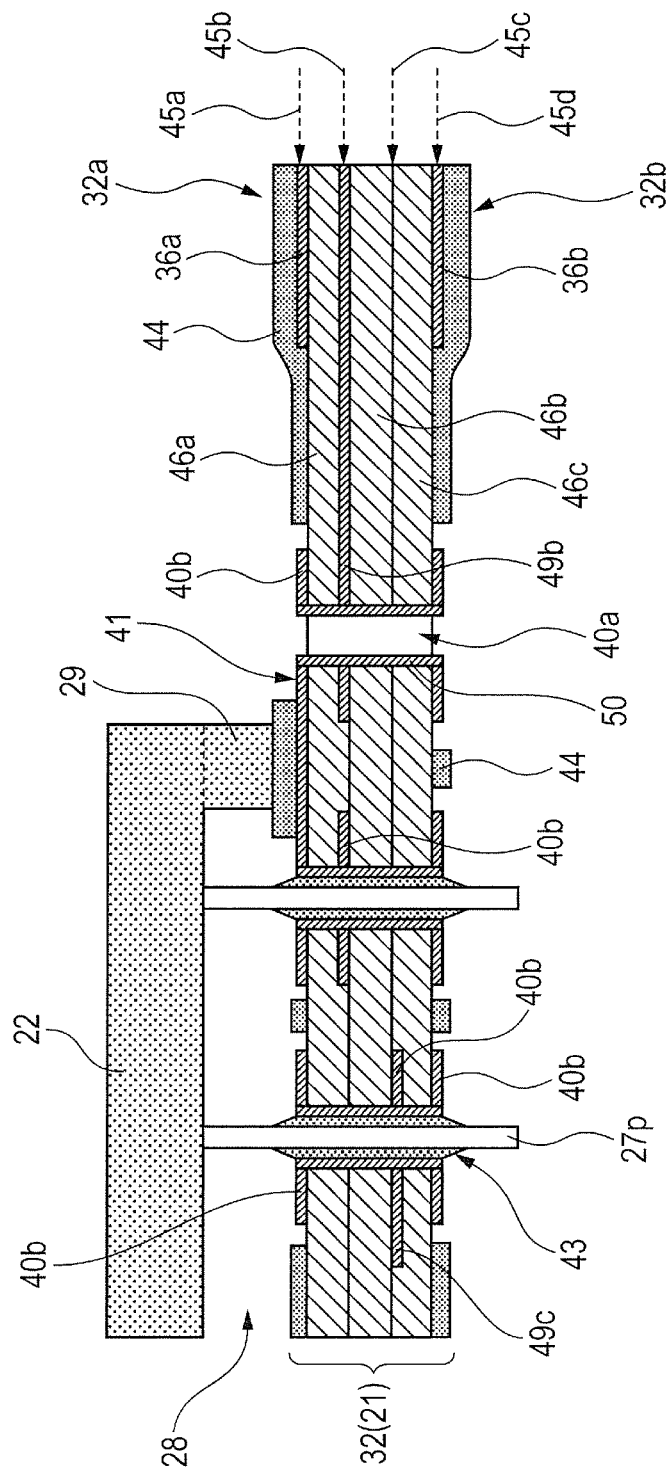
FIG. 14 is a schematic sectional view taken along the line B-B' of FIG. 13.
Figure 15:
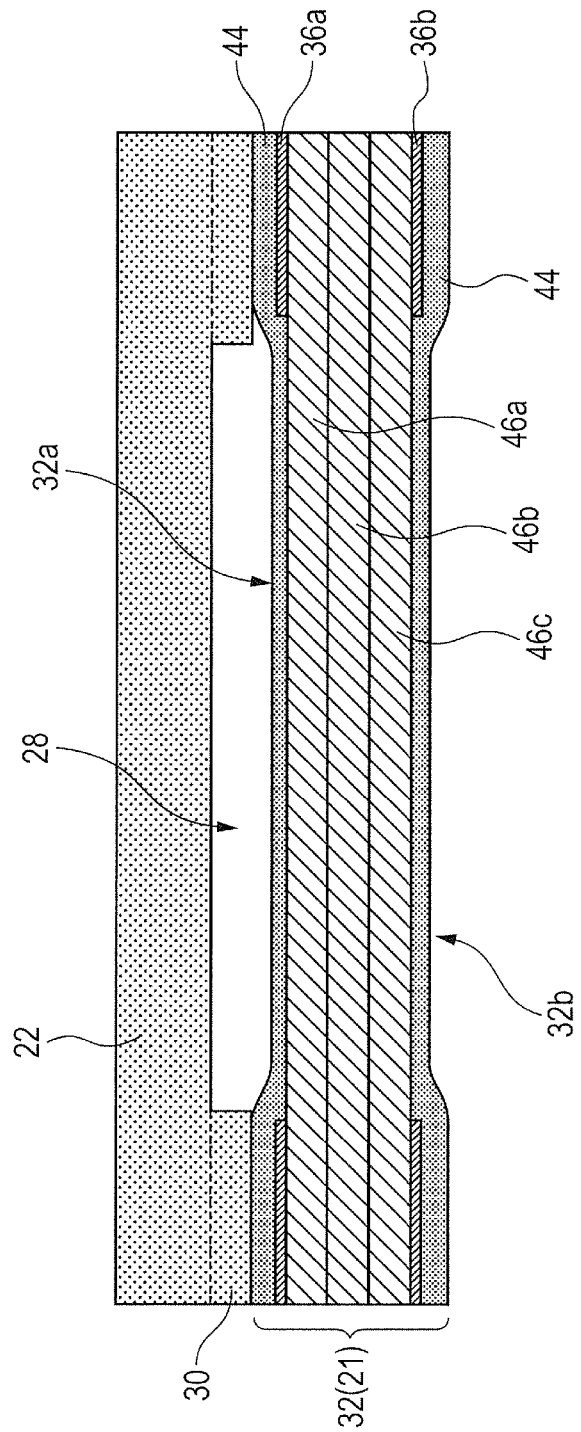
FIG. 15 is a schematic sectional view taken along the line C-C' of FIG. 13.
Figure 16:
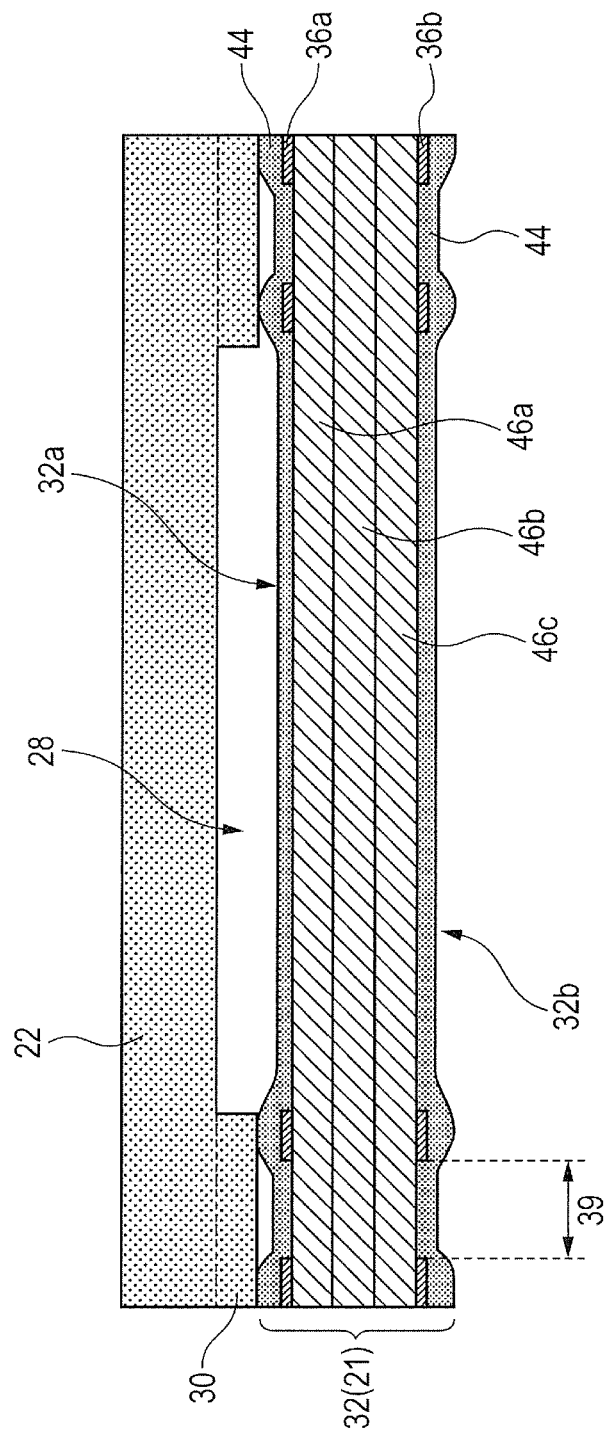
FIG. 16 is a schematic sectional view taken along the line D-D' of FIG. 13.
Figure 17:
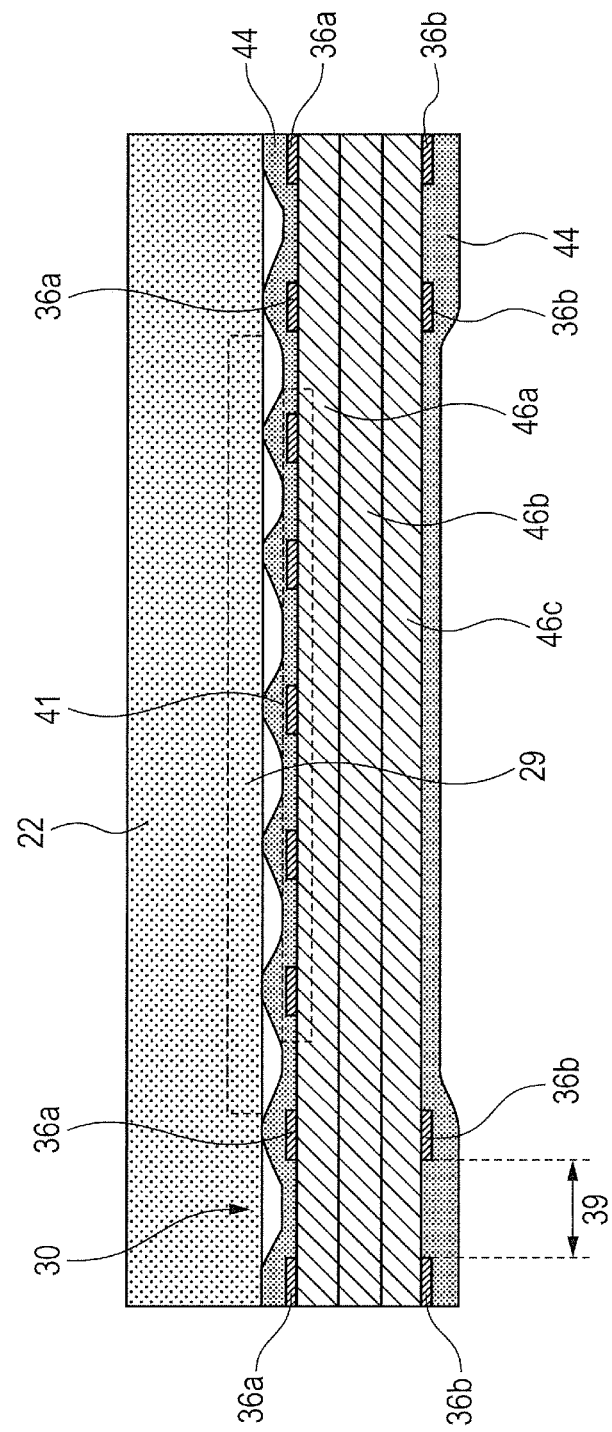
FIG. 17 is a schematic sectional view taken along the line E-E' of FIG. 13.

FIG. 8 is a top view of the burn-in board which illustrates the burn-in board structure, etc. used in the burn-in process of the method of manufacturing a semiconductor device according to the embodiment of the present invention. FIG. 9 is a schematic sectional view taken along the line A-A' of FIG. 8 (the thin film structure is not shown here). FIG. 10 is a bottom view of the burn-in board which illustrates the burn-in board structure, etc. used in the burn-in process of the method of manufacturing a semiconductor device according to the embodiment of the present invention. FIG. 11 is an enlarged top view of a unit socket and surrounding region 35 shown in FIG. 8. FIG. 12 is an enlarged bottom view of the unit socket and surrounding region 35 shown in FIG. 10. FIG. 13 is an enlarged top view of a peripheral cutout region R1 of the upper outer frame as shown in FIG. 11. FIG. 14 is a schematic sectional view taken along the line B-B' of FIG. 13 (although the metal inner surface of a through via and the metal outer surface of a land are usually solder-coated, only through vias coupled with metal pins, etc. are shown here for simple illustration). FIG. 15 is a schematic sectional view taken along the line C-C' of FIG. 13. FIG. 16 is a schematic sectional view taken along the line D-D' of FIG. 13. FIG. 17 is a schematic sectional view taken along the line E-E' of FIG. 13. Next, referring to these figures, the burn-in board structure, etc. which is used in the burn-in process of the method of manufacturing a semiconductor device according to the embodiment of the present invention will be described.

As shown in FIG. 8, the burn-in board 21 (for example, with a length of 250 mm and a width of 290 mm) is mainly comprised of an organic multilayer wiring substrate 32 such as a glass epoxy multilayer wiring substrate, with one or more than one board connector receptacle 33 at one end of the organic multilayer wiring substrate 32. A plurality of sockets 22 are grounded in a matrix pattern on the front surface 32*a* of the organic multilayer wiring substrate 32 and a test signal processing area 34 for processing test signals for the burn-in process and monitoring in the process is located at an end near the board connector receptacle 33. Extensive wiring as front side power supply/grounding wiring 36*a* lies over the most part of the front surface 32*a* of the organic multilayer wiring substrate 32. In this example, this extensive wiring 36*a* is grounding wiring.

However, in this example, the extensive wiring does not lie over most of the area under each socket 22 (for example, with a length of about 35 mm and a width of about 35 mm), some portion of the lateral vicinity of the socket 22, most of the test signal processing area 34 and the vicinity of the peripheral ends of the front surface 32*a* of the organic multilayer wiring substrate 32. The reason for this is as follows. For the convenience for the sockets and because of the concentration of signal wires, etc., it is customary practice not to provide extensive wiring in most of the area under each socket 22. It is difficult to provide extensive wiring in some portion of the lateral vicinity of the socket 22, for example, because of the need for concentrating signal wires and through vias there. Also it is difficult to provide extensive wiring in the most part of the test signal processing area 34 because, for example, a plurality of test LSIs (Large Scale Integration) etc. are concentrated and they are interconnected in a complicated manner. Also it is inadequate to provide extensive wiring, etc. in the vicinity of the peripheral ends of the front surface 32*a* of the organic multilayer wiring substrate 32 because deformation easily occurs there and friction with a slot, etc. of the burn-in apparatus may occur. However, if there are no such problems or there are such problems but a special need exists, extensive wiring may be provided in such areas.

Almost the whole area of the front surface 32*a* of the organic multilayer wiring substrate 32 is covered with solder resist film 44 (organic insulating film). Although "almost the whole area" is covered, as in the case of the above extensive wiring, the solder resist film 44 does not lie over areas which are technically difficult to cover and exceptionally excluded for other reasons. For example, the solder resist film 44 is not formed in the vicinity of the peripheral ends of the front surface 32*a* of the organic multilayer wiring substrate 32 for the same reason as in the case of the extensive wiring. However, if there are no such problems or there are such problems but a special need exists, a solder resist film may be provided in such areas.

Referring to FIG. 8, the area of the extensive wiring 36*a* is divided into unit socket and surrounding regions 35, each of which surrounds a socket 22. The unit socket and surrounding regions 35 are generally arranged almost in the same manner. Therefore, in the explanation of detailed layout of the burn-in board 21 given below, basically one unit socket and surrounding region 35 will be described. Although extensive wiring lies not only over the area of the front side power supply/grounding wiring 36*a* as shown in FIG. 8 but also over other areas such as part of the test signal processing area 34, the extensive wiring over such other areas is omitted in the figure for the convenience of illustration.

The structure of the cross section taken along the line A-A' of FIG. 8 is schematically shown in FIG. 9. As shown in FIG. 9, on the back surface 32*b* side of the organic multilayer wiring substrate 32 as the body of the burn-in board 21 has, aback cover 37 is provided to protect the back surface 32*b* and spacers 38 to maintain the strength are inserted at several spots between the back surface 32*b* of the organic multilayer wiring substrate 32 and the back cover 37.

FIG. 10 schematically shows the planar layout of the back surface 32*b* of the organic multilayer wiring substrate 32 which is opposite to that shown in FIG. 8. As shown in FIG. 10, the layout is almost the same as the layout of the front surface 32*a* as far as this drawing accuracy is used. In this case, the back side power supply/grounding wiring 36*b* (extensive wiring 36*b*) corresponds to the extensive wiring 36*a* on the front surface 32*a*. In this example, the extensive wiring 36*b* is power supply wiring. As explained later, the difference between the extensive wiring 36*a* and extensive wiring 36*b* is that due to the relation with the sockets 22, the extensive wiring 36*b* covers a larger area. In connection with extensive wiring, basically the covered area includes microscopic openings. As in the case of FIG. 8, the extensive wiring lies not only over the area of the back side power supply/grounding wiring 36*b* as shown in FIG. 10 but also over other areas such as part of the test signal processing area 34, but the extensive wiring over such other areas is omitted in the figure for the convenience of illustration. Generally the extensive wiring 36*b* on the back surface 32*b* covers a larger portion of the test signal processing area 34 than on the front surface 32*a*. This is because the devices placed here are mainly SMT (Surface Mount Package) devices and the back surface 32*b* has larger free space.

In this example, extensive wirings 36*a* and 36*b* are mostly mesh extensive wirings in which microscopic openings are almost uniformly formed all over. However, it is also possible that some part of the extensive wiring is solid extensive wiring for some reason (for example, see FIG. 27 and related figures).

FIG. 11 shows details of a unit socket and surrounding region 35 on the front surface 32*a* of the organic multilayer wiring substrate 32. As shown in FIG. 11, extensive wiring 36*a* (front side power supply/grounding wiring), for example, as a copper-based metal film, spreads all over the areas around the socket 22 except the corners (corner support portions 30) under the socket 22 and the central area (which mostly corresponds to a device stage 24) under the socket 22. The center of the socket 22 corresponds to the device stage 24 (see FIG. 20) which will be described later and in four directions around it, via regions 48 for socket pins and the same through via formation regions 47 in the bottom protrusion peripheries are arranged almost in a rotationally symmetrical manner. In four directions 45 degrees rotated with respect to the via regions 48 for socket pins and bottom protrusion peripheral the through via formation regions 47 in the bottom protrusion peripheries, the corner support portions 30 (regions under them) are located and as explained above, the mesh extensive wiring 36*a* also extends over these areas. In the through via formation regions 47 in the bottom protrusion peripheries, through vias and lands (for example, copper-based metal film) at via ends, and interconnection wires 41 (for example, copper-based metal film) for interconnecting them are provided.

FIG. 12 shows details of the unit socket and surrounding region 35 shown in FIG. 8 on the back surface 32b of the organic multilayer wiring substrate 32. As shown in FIG. 12, the layout is the same as that of the front surface 32a except that the mesh extensive wiring 36b (back side power supply/grounding wiring) extends over the area corresponding to the device stage 24 (FIG. 11) and its surroundings. This is because there are fewer restrictions than on the front surface 32a. In many cases, the interconnection wires 41 for coupling lands at through via ends are formed on the front surface 32a.

FIG. 13 shows the outer frame peripheral cutout region R1 shown in FIG. 11 in enlarged form. As shown in FIG. 13, a through-via end land 40b around each through via 40a is provided and these lands 40b and interconnection wire 41 are integrated to form a metal film. Microscopic openings 39 are uniformly formed in the front side power supply/grounding wiring 36a (mesh extensive wiring) and in this example, they are arranged in a square grid pattern (see FIG. 11 and related figures). The length L of one side of a microscopic opening 39 is, for example, 1 mm or so (preferably within a range from 0.5 millimeter to several millimeters) and square grid half pitch HP is, for example, 1 mm or so (preferably within a range from 0.5 millimeter to several millimeters). Therefore, in this example, the opening ratio is about 25% (preferably within a range from 15% to 35% or so). In this embodiment, the length of one side of a minute aperture 39 is almost equal to, or smaller than, the diameter of a land 40b. If the microscopic opening is a rectangular slit, its short side is almost equal to, or smaller than, the diameter of the land 40b.

As can be understood from FIG. 13, mesh extensive wiring 36a (extensive wiring) is not formed in the through via formation region 47 in the bottom protrusion periphery (the frame-shaped protrusion outside peripheral region 42 plus the via region 48 for socket pins). One reason for this is that through vias 40a, lands 40b, and interconnection wires 41 are disposed in a relatively dense manner. The frame-shaped protrusion outside peripheral region 42 in the through via formation region 47 in the bottom protrusion periphery is not a region which the socket 22 occupies but a region in which the mesh extensive wiring 36a is exceptionally not formed, and the via region 48 for socket pins is a region which planarly overlaps the back recess region 28 of the socket 22 which will be explained later.

The corresponding part of the back surface, as shown in FIG. 12, is the same as shown in FIG. 13 except the interconnection wires 41, so description thereof is omitted here (generally, on the back surface, there are no or few interconnection wires corresponding to the interconnection wires 41).

FIG. 14 is a sectional view taken along the line B-B' of FIG. 13 showing details of the structure of the organic multilayer wiring substrate 32. For example, as shown in FIG. 14, the organic multilayer wiring substrate 32 is a four-layer glass epoxy interconnection substrate and the four wiring layers may include a front side outermost power supply/grounding wiring layer 45a (in this example, a grounding wiring layer), a second-layer internal signal wiring layer 45b, a third-layer internal signal wiring layer 45c, and a back side outermost power supply/grounding wiring layer 45d (in this example, a power supply wiring layer). The insulating sheets of the organic multilayer wiring substrate 32 are three pieces of glass epoxy prepreg, namely organic insulating sheets 46a, 46b, and 46c. However, the insulating sheets of the organic multilayer wiring substrate 32 are not limited thereto; for example, they may include a core material and two pieces of prepreg formed on the front and back surfaces of the core material.

The organic multilayer wiring substrate 32 (body of the burn-in board 21) has a plurality of through vias 40a, some of which are penetrated by lower pins 27p of contact electrodes (FIG. 20) of the socket 22. An in-via metal film 50 (for example, copper-based metal film) is formed on the inner surface of each through via 40a.

The area of the contact electrode 27 coincides with the back recess region 28 of the socket 22. Provided on the front surface 32a of the organic multilayer wiring substrate 32, namely in the front side outermost power supply/grounding wiring layer 45a, are lands 40b, interconnection wires 41, front side power supply/grounding wiring 36a and so on, in which main portions of the lands 40b, interconnection wires 41, front side power supply/grounding wiring 36a (in this example, grounding wiring), and organic insulating sheet 46a are covered by solder resist film 44. The solder resist film 44 covers almost all of them except the through vias 40a, lands 40b and their surroundings. The reason that it does not cover the lands 40b and their surroundings is that a solder film is to be made over them (in FIGS. 14 to 17, for the convenience of illustration, the solder layer is omitted except the solder layer over the via inside portions for pin connection). It should be noted here that the bottom of the bottom frame-shaped protrusion 29 of the socket 22 lies over the upper surface of the solder resist film 44 formed over the interconnection wires 41. More specifically, as shown in FIG. 17 as a sectional view taken along the line E-E' of FIG. 13, the bottom frame-shaped protrusion 29 of the socket 22 is located so as to partially overlap each of the interconnection wires 41 extending inside and outside the socket 22 in a plan view. In this case, if the front side power supply/grounding wiring 36a does not exist in an area which overlaps each corner of the socket 22 (corner support portion 30), the flatness of the solder resist film 44 formed over the front surface 32a of the organic multilayer wiring substrate 32 is low. In other words, referring to FIG. 17, on the front surface 32a of the organic multilayer wiring substrate 32, the surface of the solder resist film 44 formed in the area which overlaps the corner support portion 30 is lower than the surface of the solder resist film 44 formed over the interconnection wires 41. As a consequence, there is a risk that the pressure (pushing or handling pressure) produced when putting a semiconductor device (semiconductor package) in the socket 22 concentrates on the interconnection wires 41 through the solder resist film 44 formed over the interconnection wires 41 and causes disconnection in the interconnection wires 41. However, in this embodiment, since the front side power supply/grounding wiring 36a lies in the area which overlaps each corner (corner support portion 30) of the socket 22 in a plan view, though this arrangement is not essential, as shown in FIG. 17, on the front surface 32a of the organic multilayer wiring substrate 32, the surface of the solder resist film 44 formed in the area which overlaps the corner support portion 30 is almost at the same level as the surface of the solder resist film 44 formed over the interconnection wires 41. As a consequence, the pressure (pushing or handling pressure) produced when putting a semiconductor device (semiconductor package) in the socket 22 is dispersed or distributed not only over the interconnection wires 41 but also over the front side power supply/grounding wiring 36a in the area which overlaps the corner support portion 30, so that the risk of disconnection in the interconnection wires 41 is reduced.

Lands 40b, second-layer internal signal wiring 49b and so on are provided in the second-layer internal signal wiring layer 45b and each of them is coupled with the in-via metal film 50 in the corresponding through via 40a.

Lands 40b, third-layer internal signal wiring 49c and so on are provided in the third-layer internal signal wiring layer 45c and each of them is coupled with the in-via metal film 50 in the corresponding through via 40a.

Provided on the back surface 32b of the organic multilayer wiring substrate 32, namely in the back side outermost power supply/grounding wiring layer 45d are lands 40b, back side power supply/grounding wiring 36b (in this example, power supply wiring) and so on, in which main portions of the lands 40b, back side power supply/grounding wiring 36b, and organic insulating sheet 46c are covered by solder resist film 44. The solder resist film 44 covers almost all of them except the through vias 40a and lands 40b and their surroundings.

The socket 22 lies over the front surface 32a of the organic multilayer wiring substrate 32 (body of the burn-in board 21) and the lower pin 27p of its contact electrode 27 penetrates the corresponding through via 40a and is coupled with the in-via metal film 50 through the solder layer 43. The bottom frame-shaped protrusion 29 of the socket 22 lies over the solder resist film 44 overlying the interconnection wires 41, over the front surface 32a of the organic multilayer wiring substrate 32.

FIG. 15 is a sectional view taken along the line C-C' of FIG. 13. As shown in FIG. 15, the front side power supply/grounding wiring 36a is provided in the front surface 32a of the organic multilayer wiring substrate 32 (body of the burn-in board 21), and the solder resist film 44 is provided over the front side power supply/grounding wiring 36a and the front surface 32a of the organic multilayer wiring substrate 32. The socket 22 is located over the solder resist film 44 overlying the front side power supply/grounding wiring 36a through the corner support portion 30. Thus the surface of the solder resist film 44 which is located in the area overlapping the corner support portion 30 of the socket 22 and formed over the front side power supply/grounding wiring 36a is higher than when the front side power supply/grounding wiring 36a is not located in the area overlapping the corner support portion 30 of the socket 22, so it is less likely that the interconnection wires 41 are damaged due to friction between the bottom frame-shaped protrusion 29 of the socket 22 and the interconnection wires 41.

The back side power supply/grounding wiring 36b is provided on the back surface 32b of the organic multilayer wiring substrate 32 and solder resist film 44 is provided over the back surface 32b of the organic multilayer wiring substrate 32.

FIG. 16 is a sectional view taken along the line D-D' of FIG. 13. As shown in FIG. 16, the cross section is the same as the one shown in FIG. 15 except that there are microscopic openings 39 in the front side power supply/grounding wiring 36a and back side power supply/grounding wiring 36b.

FIG. 17 is a sectional view taken along the line E-E' of FIG. 13. As shown in FIG. 17, the cross section is the same as the one shown in FIG. 16 except that there are a plurality of interconnection wires 41 over the front side power supply/grounding wiring 36a of the organic multilayer wiring substrate 32. As described above, the bottom frame-shaped protrusion 29 of the socket 22 lies over the solder resist film 44 overlying the interconnection wires 41. The solder resist film 44 covers the front surface 32a (including the microscopic openings 39) of the organic multilayer wiring substrate 32, the front side power supply/grounding wiring 36a, and the interconnection wires 41. Similarly, on the back side power supply/grounding wiring 36b of the organic multilayer wiring substrate 32, the solder resist film 44 covers the back surface 32b (including the microscopic openings 39) of the organic multilayer wiring substrate 32 and the back side power supply/grounding wiring 36b.

3. Explanation of the Socket Structure, Etc. on the Burn-In board Used for the Burn-in Process of the Method of Manufacturing a Semiconductor Device According to the Embodiment of the Present Invention (See FIGS. 18 to 21 and Related Figures)

An example of a standard socket for automatic loading as a burn-in socket will be shown here, though many types of burn-in sockets are available and obviously any type may be used. The mechanical action mechanism of this kind of socket for automatic loading is well known so its description is omitted here and only the action of a contact electrode will be schematically explained below.

A concrete explanation is given here by taking QFP (Quad Flat Package) as an example of the device to be tested, though any of other types of test device packages (device types), such as QFN (Quad Flat Non Lead), BGA (Ball Grid Array), and bare chips, may be used.

Figure 18:
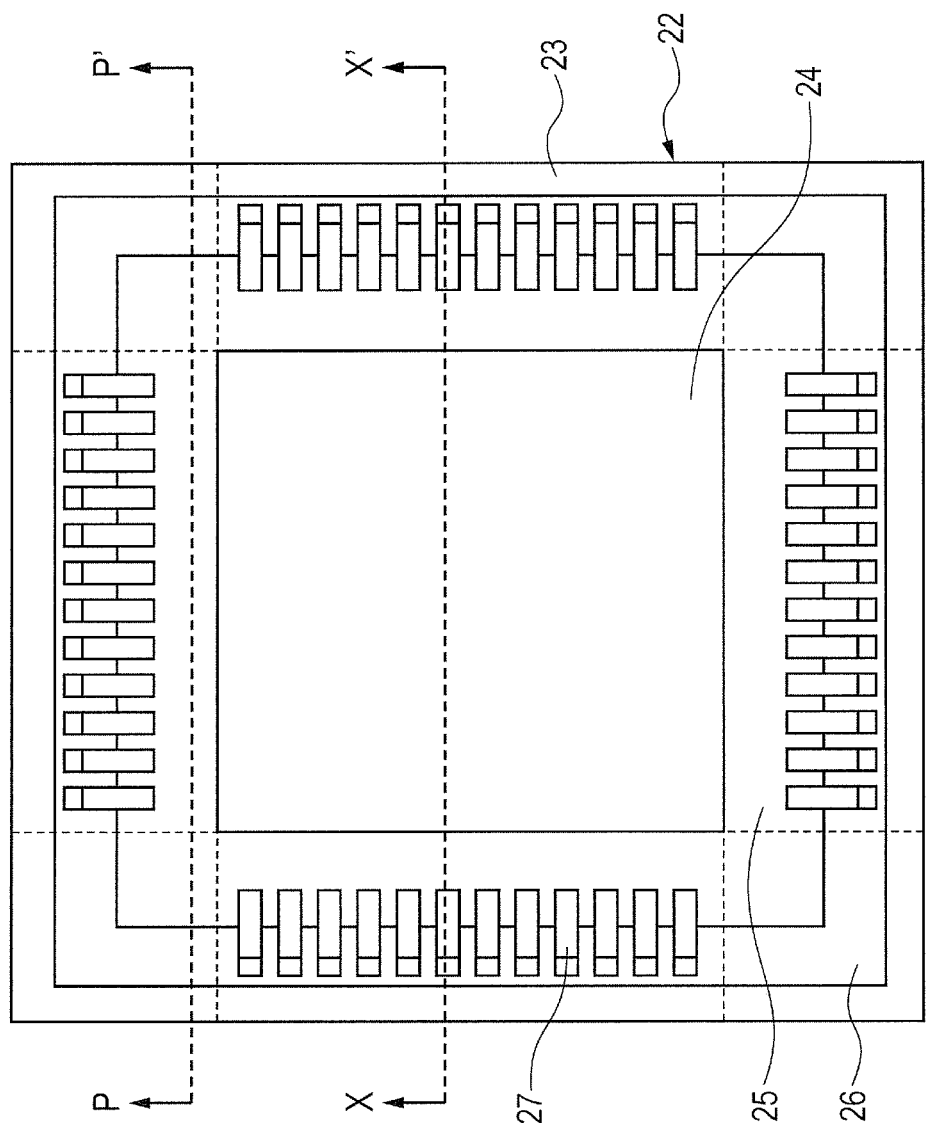
FIG. 18 is a schematic top view of the socket which illustrates the socket structure, etc on the burn-in board used for the burn-in process of the method of manufacturing a semiconductor device according to the embodiment of the present invention.
Figure 19:
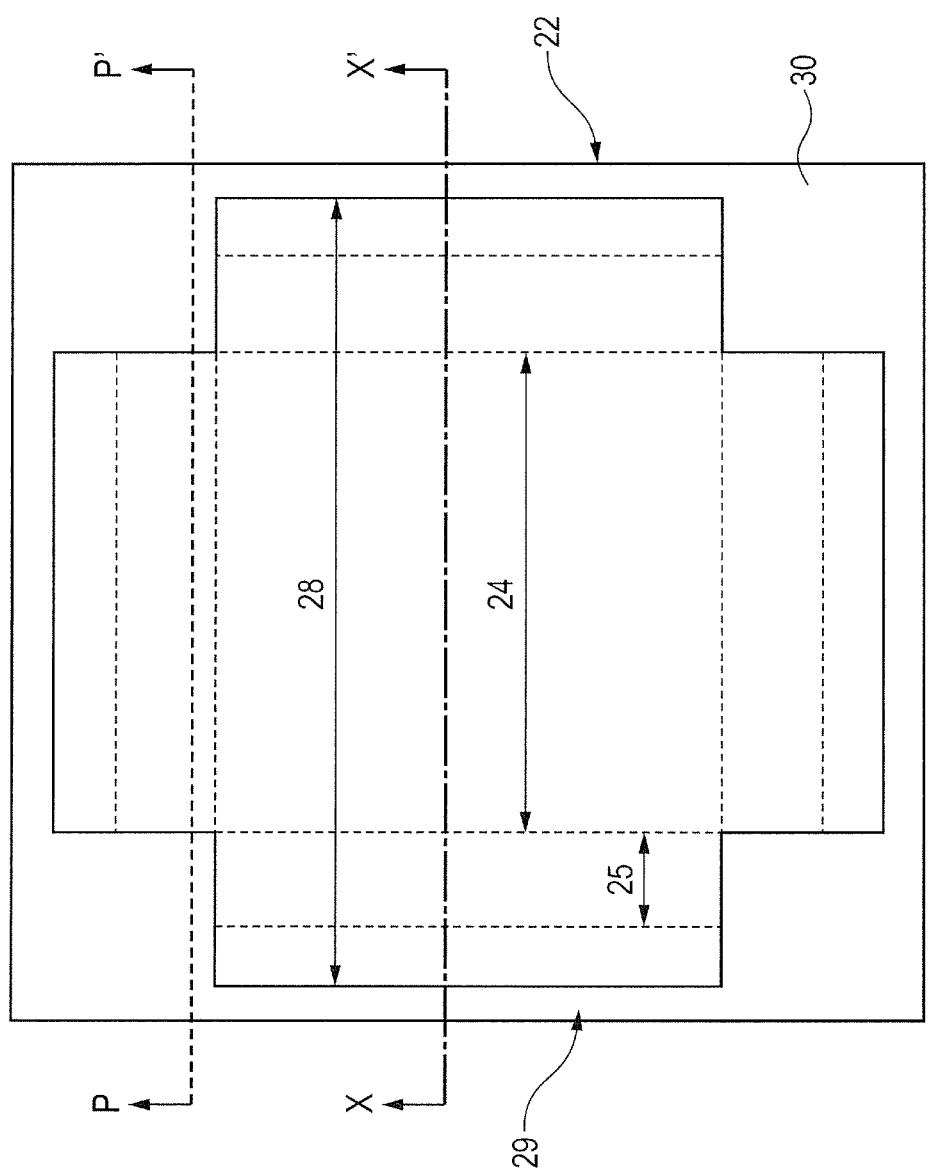
FIG. 19 is a schematic bottom view of the socket which illustrates the socket structure, etc on the burn-in board used for the burn-in process of the method of manufacturing a semiconductor device according to the embodiment of the present invention.

FIG. 18 is a schematic top view of the socket which illustrates the socket structure, etc on the burn-in board used for the burn-in process of the method of manufacturing a semiconductor device according to the embodiment of the present invention. FIG. 19 is a schematic bottom view of the socket which illustrates the socket structure, etc on the burn-in board used for the burn-in process of the method of manufacturing a semiconductor device according to the embodiment of the present invention. FIG. 20 is a schematic sectional view taken along the line X-X' of FIG. 18. FIG. 21 is a schematic sectional view taken along the line P-P' of FIG. 18. Referring to these figures, the socket structure, etc. on the burn-in board used for the burn-in process of the method of manufacturing a semiconductor device according to the embodiment of the present invention will be explained below.

FIG. 18 is a schematic top view of a test socket 22. As shown in FIG. 18, a device stage 24 on which the device to be tested is placed is located in the center of the socket 22 and a lead stage 25 on which external leads, etc for the device to be tested are placed is located around it. A plurality of contact electrodes 27 protrude from the bottom surface 26 of the upper side of the socket 22 and their tips are oriented down toward the lead stage 25. An upper outer frame 23 is provided in a way to surround the peripheral edges of the socket 22.

FIG. 19 is a bottom view of the socket 22 shown in FIG. 18. As shown in FIG. 19, on the back side of the socket 22, for example, a cross back recess region 28 is provided and along with it, corner support portions 30 protruding almost at the same height are provided in the corners and a bottom frame-shaped protrusion 29 coupling them is provided.

FIG. 20 is a sectional view taken along the line X-X' of FIGS. 18 and 19. As shown in FIG. 20, in this example, the device stage 24 of a device holder 31 is slightly higher than the lead stage 25. The other end of each contact electrode 27 is a lower pin 27p which penetrates a through via 40a in the organic multilayer wiring substrate 32 (body of the burn-in board 21). As can be understood from the figure, the socket 22 is made to contact the front surface 32a of the organic multilayer wiring substrate 32 through the bottom frame-shaped protrusion 29 on the lateral sides of the socket 22.

FIG. 21 is a sectional view taken along the line P-P' of FIGS. 18 and 19. As shown in FIG. 21, the socket 22 is made to contact the front surface 32a of the organic multilayer wiring substrate 32 through the corner support portions 30 in the corners of the socket 22.

4. Explanation of a Burn-in Apparatus, Etc. Used for the Burn-in Process of the Method of Manufacturing a Semiconductor Device According to the Embodiment of the Present Invention (See FIGS. 22 to 24 and Related Figures)

As for the number of burn-in boards housed in the burn-in apparatus, a relatively small number of boards are shown here for simple illustration, though actually a larger number of boards are housed therein in order to decrease the processing time per device to be tested.

Figure 22:
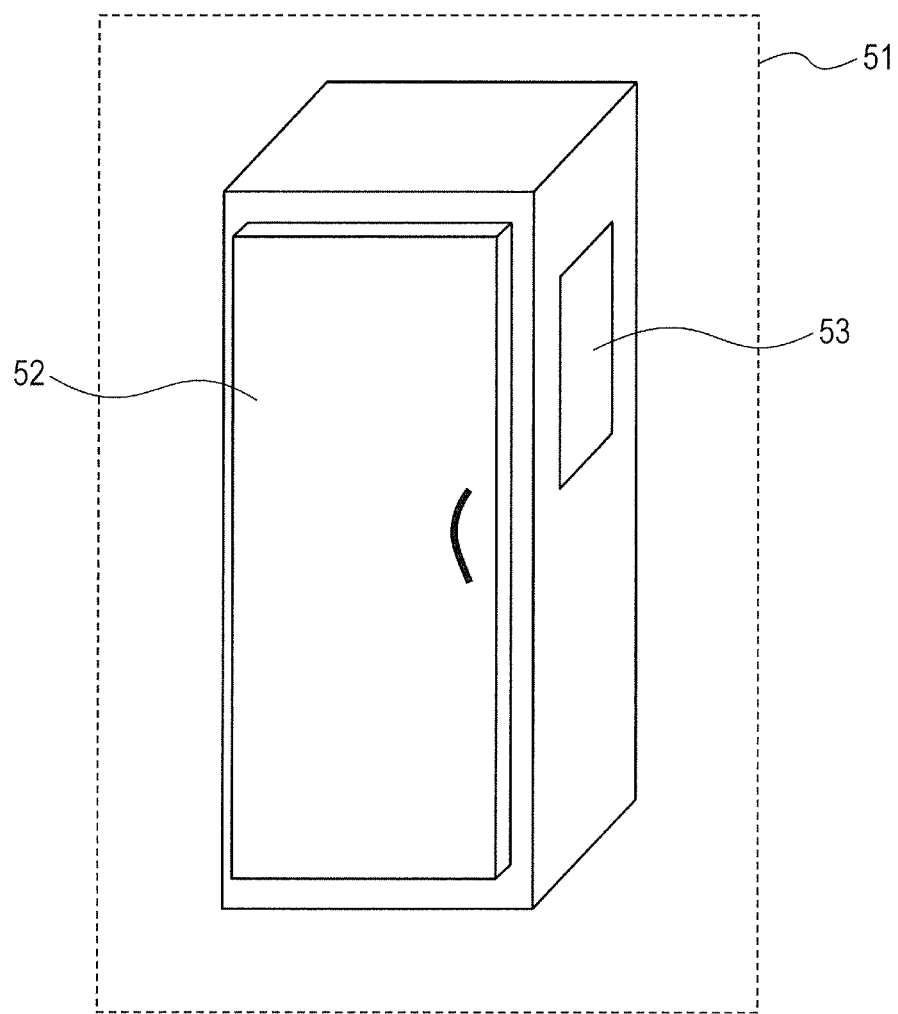
FIG. 22 is a perspective view of a burn-in apparatus used for the burn-in process of the method of manufacturing a semiconductor device according to the embodiment of the present invention.
Figure 23:
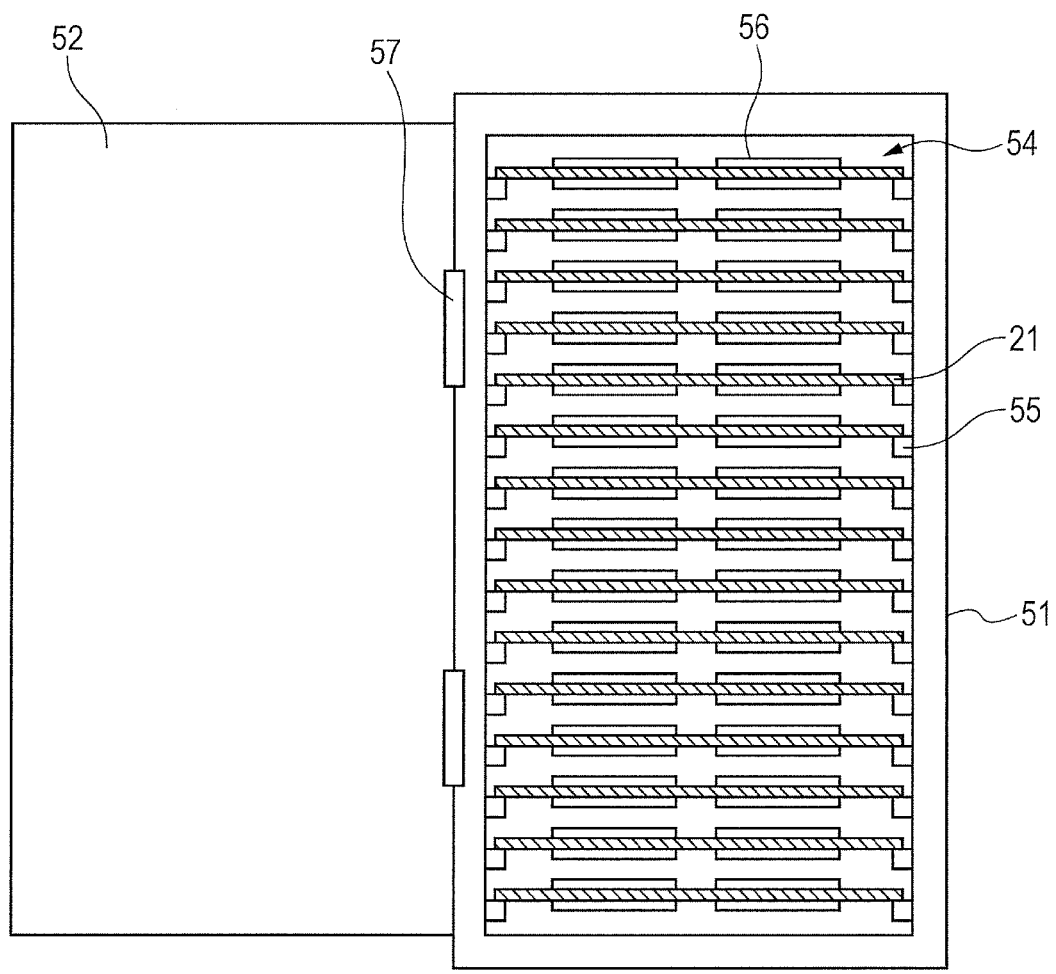
FIG. 23 is a schematic front view of the burn-in apparatus shown in FIG. 22 with its door open.
Figure 24:
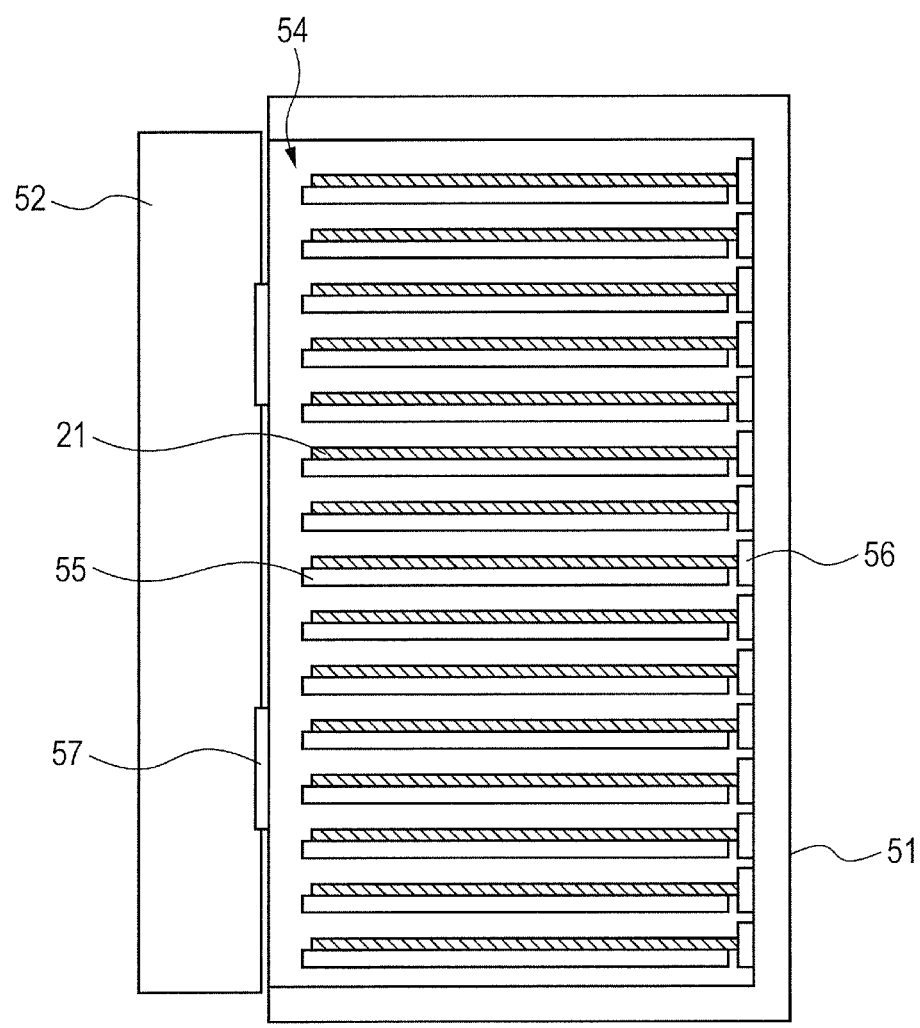
FIG. 24 is a schematic transparent side view showing the inside of the burn-in apparatus shown in FIG. 23.

FIG. 22 is a perspective view of a burn-in apparatus used for the burn-in process of the method of manufacturing a semiconductor device according to the embodiment of the present invention. FIG. 23 is a schematic front view of the burn-in apparatus shown in FIG. 22 with its door open. FIG. 24 is a schematic transparent side view showing the inside of the burn-in apparatus shown in FIG. 23. Referring to these figures, the burn-in apparatus used for the burn-in process of the method of manufacturing a semiconductor device according to the embodiment of the present invention will be explained below.

FIG. 22 is a perspective view of the burn-in apparatus 51 used for the burn-in step 111 in FIG. 1. As shown in FIG. 22, the burn-in apparatus 51 has a door 52 through which a burn-in board is put in and out, and an operation panel 53 for controlling the burn-in process.

FIGS. 23 and 24 are a front view and a schematic transparent side view of the burn-in apparatus 51 shown in FIG. 22, respectively, in which the door 52, held by door supporters 57, is open. As shown in FIGS. 23 and 24, in this example, a plurality of burn-in boards 21 (which each contain a device to be tested) are put in a high temperature tank 54 through slots 55. Each burn-in board 21 is coupled to the burn-in apparatus 51 by a board connector 56, etc.

5. Explanation of the Burn-in Process, Etc. of the Method of Manufacturing a Semiconductor Device According to the Embodiment of the Present Invention (See FIGS. 25, 26 and 1 and Related Figures)

Here, among various types of stress in the burn-in process, focus will be placed on high temperature environment. The reason is that high temperature environment is generally thought to be the most determinant factor to accelerate initial failures. However, a multi-tiered combination of another stress factor with it or simple addition of another stress factor is not excluded.

Figure 25:
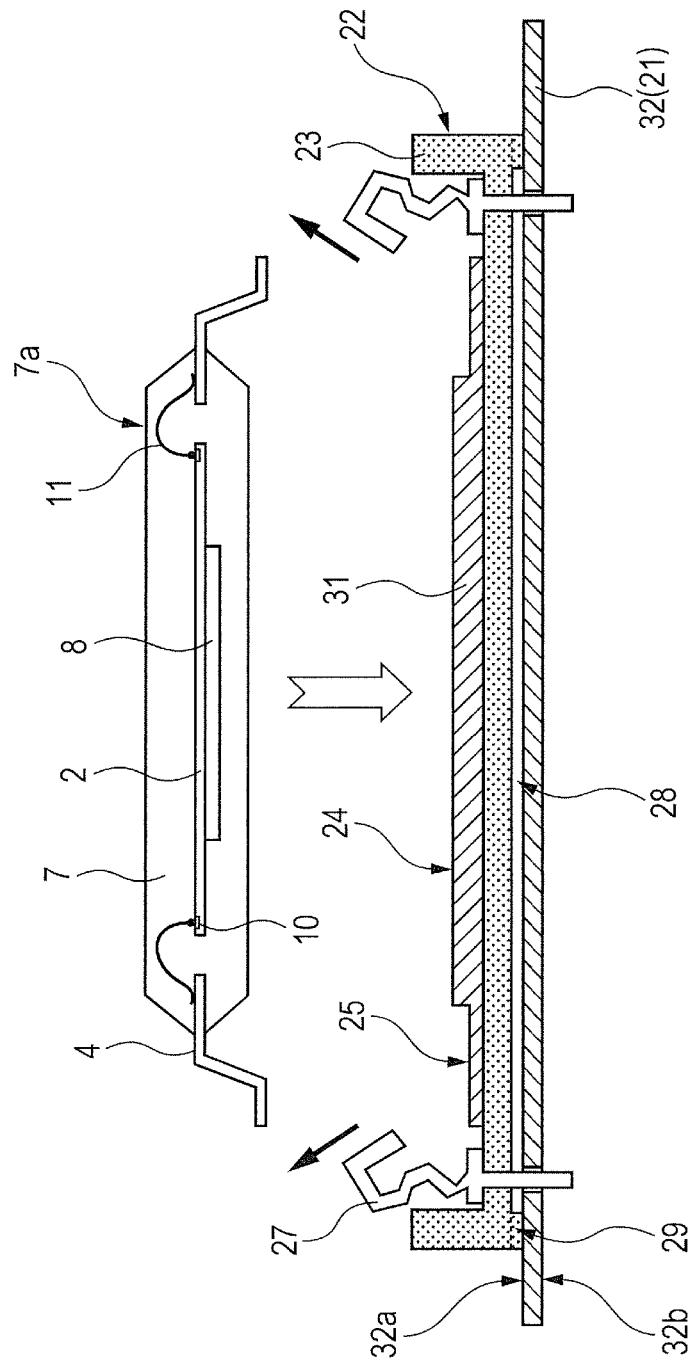
FIG. 25 is a schematic sectional view of the socket, etc. shown in FIG. 20 which illustrates how the device to be tested is loaded in the socket in the burn-in process of the method of manufacturing a semiconductor device according to the embodiment of the present invention.
Figure 26:
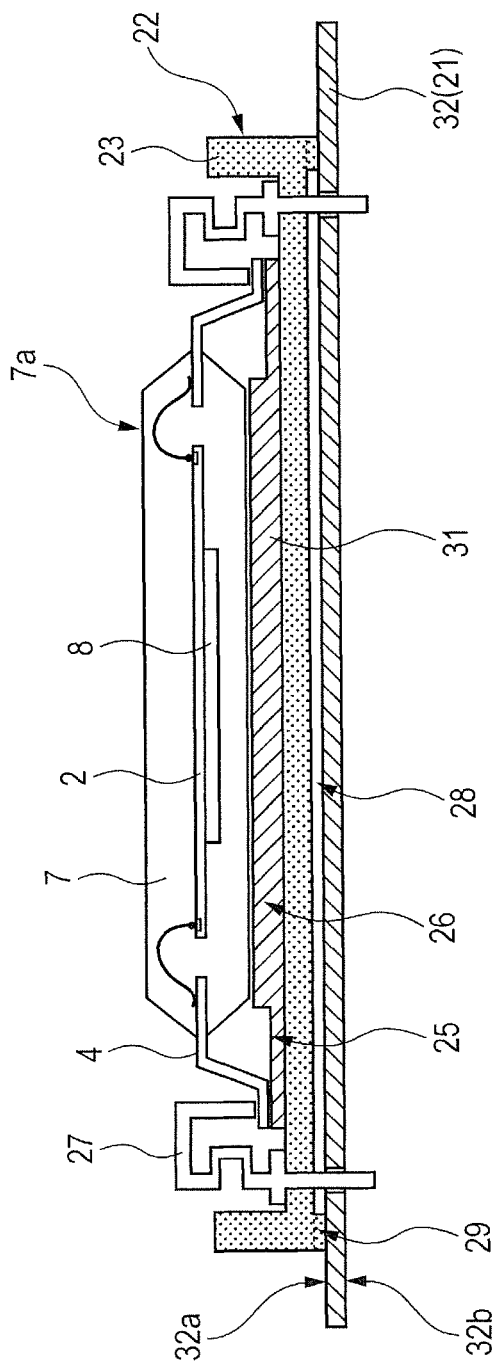
FIG. 26 is a schematic sectional view of the socket, etc. shown in FIG. 20 which illustrates the relation between the socket and the device being tested during the burn-in process of the method of manufacturing a semiconductor device according to the embodiment of the present invention.

FIG. 25 is a schematic sectional view of the socket, etc. shown in FIG. 20 which illustrates how the device to be tested is loaded in the socket in the burn-in process of the method of manufacturing a semiconductor device according to the embodiment of the present invention. FIG. 26 is a schematic sectional view of the socket, etc. shown in FIG. 20 which illustrates the relation between the socket and the device being tested during the burn-in process of the method of manufacturing a semiconductor device according to the embodiment of the present invention. Referring to these figures, the burn-in process, etc. of the method of manufacturing a semiconductor device according to the embodiment of the present invention will be explained below.

Outside the burn-in apparatus 51, the device to be tested which is shown in FIG. 7 is placed in a socket 22 of the burn-in board shown in FIG. 8 using, for example, an auto-loader.

Next, an example of the structure of the device to be tested 7 will be briefly explained. In this example, the device to be tested 7 includes a resin sealing body 7 (for example, epoxy resin sealing resin) and a plurality of leads protruding from it and for example, a semiconductor chip 2, a die pad 8, bonding wires 11 (for example, gold bonding wires) and so on are encapsulated in the resin sealing body 7. The bonding wires 11 couple a pad 10 (for example, aluminum bonding pad) over the semiconductor chip 2 to the inner lead portions of leads 4.

As shown in FIG. 25, when loading the device 7 in the socket 22, the contact electrodes 27 open simultaneously with loading action to allow the device 7 to be inserted.

As shown in FIG. 26, simultaneously when the device 7 is placed in a given position, the contact electrodes 27 return to their original state and push the leads 4 against the lead stage 25 (namely the contact electrodes 27 come into contact with the external terminals of the semiconductor device. The burn-in process is performed when they are in contact with each other in this way). Coupling between the leads 4 of the device 7 and the socket 22 is thus completed. When devices to be tested 7 have been loaded in all the sockets shown in FIG. 10, the burn-in board 21 is inserted into a slot 55 of the burn-in apparatus 51 and simultaneously other burn-in boards are also inserted into the other slots respectively and each burn-in board is coupled with a board connector 56. After loading the burn-in boards 21, the burn-in step 111 (FIG. 1) is started. In this example, the burn-in process lasts about eight hours (usually in the range from several hours to ten-odd hours). The temperature of the high temperature tank 54 during the burn-in process is, for example, about 125 degrees Celsius (other temperatures are acceptable but due to the need for acceleration and heat resistance of devices, etc., for the present the tank temperature is limited to a given range, specifically about 125 degrees Celsius from a practical viewpoint. During the burn-in process, voltage-current higher than normal voltage-current is applied to the device to be tested 7 and the device is maintained in an operating state. Generally, during the burn-in process the devices 7 are being monitored to identify a device which has failed and record it (usually it is recorded in a memory device in the form of electronic data). Power supply to a device 7 which may cause a problem due to a failure is turned off. In addition, during the burn-in process, a test for an item which uses a relatively low speed and takes longer time (test item for which a test is supposed to be performed in the wafer probe test or final test) may be performed (namely "test burn-in").

After the burn-in process is ended, the burn-in boards 21 are unloaded, for example, automatically and according to the recorded monitor data, etc., defective devices are removed and non-defective devices proceed to the next package test step 112 (final test) as shown in FIG. 1. The devices 7 which have passed through the package test step 112 (usually test time per device is several seconds) are subjected to a visual inspection step 113 (FIG. 1) and non-defective devices 7 proceed to a packing step 114 (FIG. 1). The packed products are shipped (shipment step 115 in FIG. 1).

6. Explanation of a Variation of the Unit Socket and Surrounding Region on the Burn-in Board Used for the Burn-in Process of the Method of Manufacturing a Semiconductor Device According to the Embodiment of the Present Invention (See FIG. 27 and Related Figures)

In this section, a variation of the arrangement of the front side power supply/grounding wiring 36a shown in FIG. 11 will be described. As in the example of FIG. 11, in this variation, front side power supply/grounding wiring 36a lies almost all over the areas under the corner support portions 30, though it need not lie almost all over the areas under the corner support portions 30.

Figure 27:
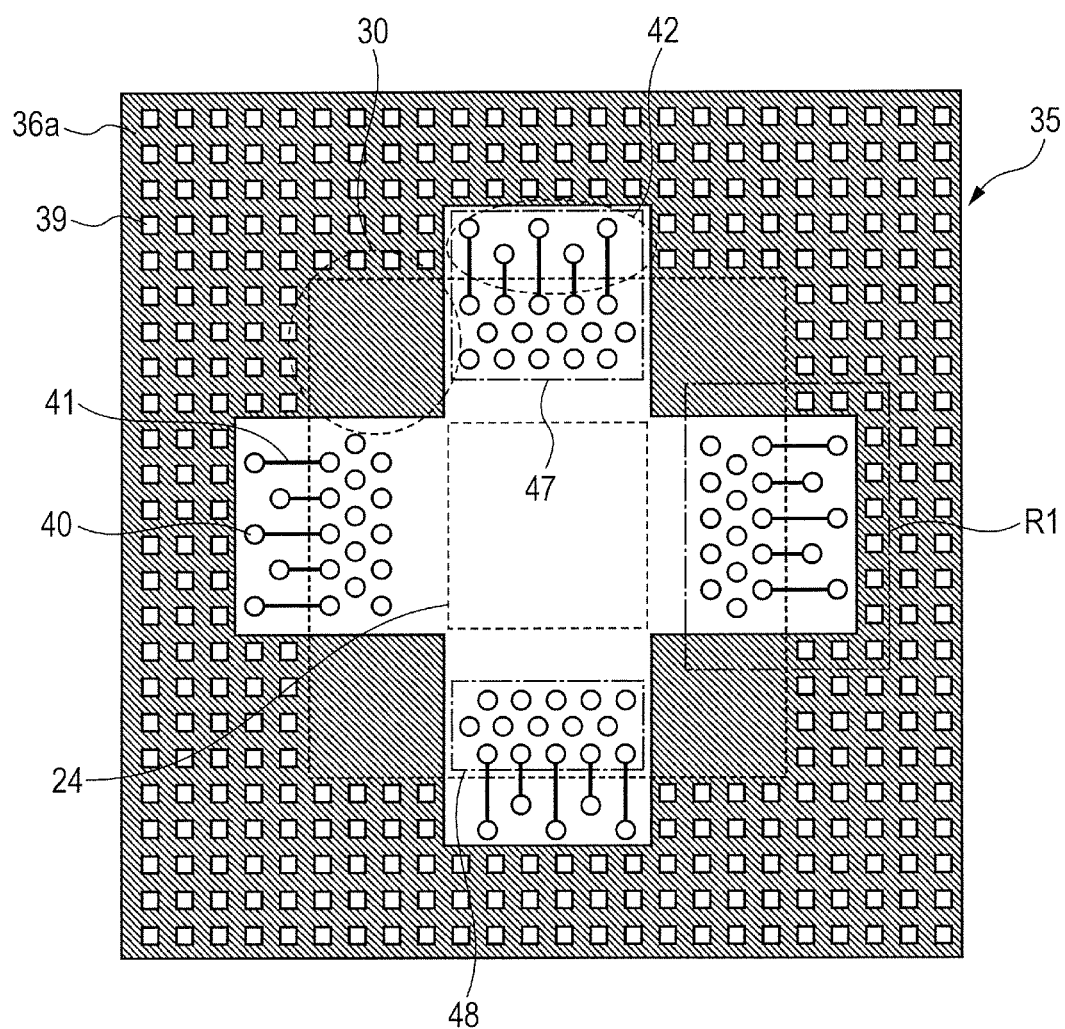
FIG. 27 is an enlarged top view of the unit socket and surrounding region shown in FIG. 8 which is equivalent to FIG. 11 and illustrates a variation of the unit socket and surrounding region of the burn-in board used for the burn-in process of the method of manufacturing a semiconductor device according to the embodiment of the present invention.

FIG. 27 is an enlarged top view of a unit socket and surrounding region 35 shown in FIG. 8 which is equivalent to FIG. 11 and illustrates a variation of the unit socket and surrounding region of the burn-in board used for the burn-in process of the method of manufacturing a semiconductor device according to the embodiment of the present invention. Referring to FIG. 27, the variation of the unit socket and surrounding region of the burn-in board used for the burn-in process of the method of manufacturing a semiconductor device according to the embodiment of the present invention will be explained below.

As shown in FIG. 27, the difference from FIG. 11 is that the front side power supply/grounding wiring 36a under the corner support portions 30 of the socket 22 is not mesh extensive wiring but solid extensive wiring. Therefore, the solder resist film 44 under the corner support portions 30 is formed over the flat front side power supply/grounding wiring 36a and the corner support portions 30 are in a sufficiently high position. The upper surface of the solder resist film 44 under the corner support portions 30 is slightly higher than the upper surface of the solder resist film 44 in the through via formation region 47 in the bottom protrusion periphery with the bottom frame-shaped protrusion 29, which further reduces the risk of damage to the interconnection wires 41 (FIG. 13) due to friction with the bottom frame-shaped protrusion 29. However, the possibility that solder resist fragments come off the surface of the burn-in board 21 is slightly higher than when the mesh extensive wiring lies under the corner support portions 30 as shown in FIG. 11.

7. Explanation of a Variation of the Arrangement of Microscopic Openings in the Burn-in Board Used for the Burn-in Process of the Method of Manufacturing a Semiconductor Device According to the Embodiment of the Present Invention (See FIGS. 28 and 29 and Related Figures)

Figure 28:
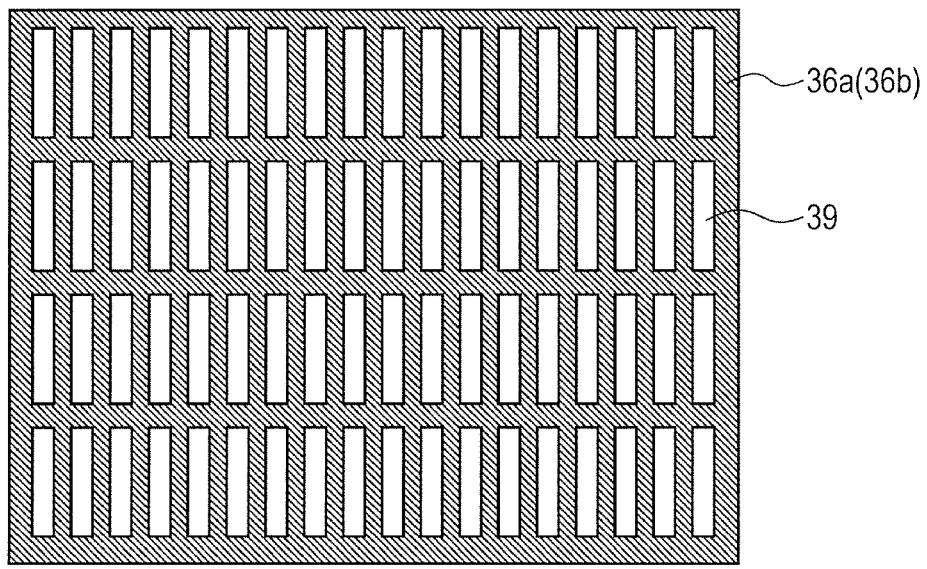
FIG. 28 illustrates the planar arrangement of microscopic openings of front side power supply/grounding wiring (back side power supply/grounding wiring), as a variation of the arrangement of microscopic openings (orthogonal grid arrangement of slit openings) in the burn-in board used for the burn-in process of the method of manufacturing a semiconductor device according to the embodiment of the present invention.
Figure 29:
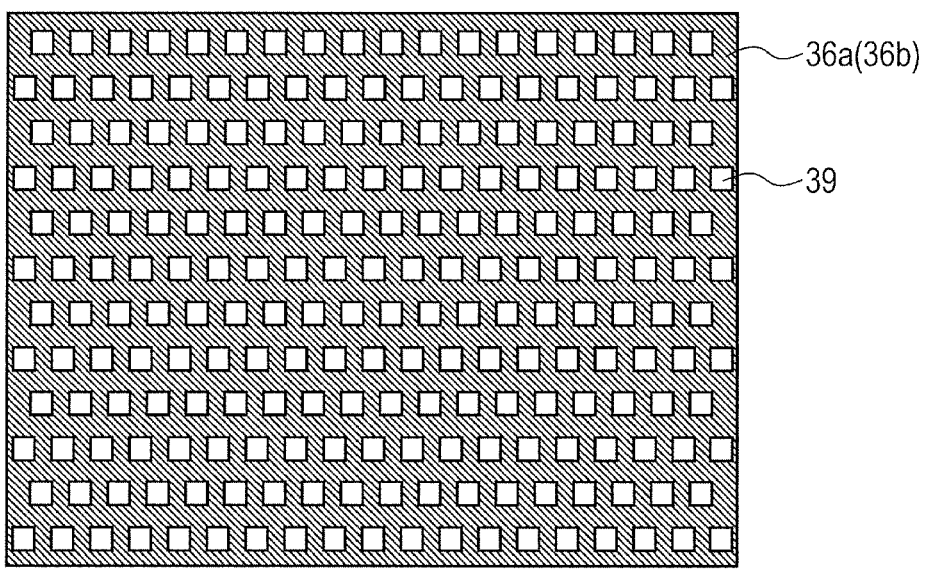
FIG. 29 illustrates the planar arrangement of microscopic openings of the front side power supply/grounding wiring (back side power supply/grounding wiring), as a variation of the arrangement of microscopic openings (staggered arrangement of dot-like openings) in the burn-in board used for the burn-in process of the method of manufacturing a semiconductor device according to the embodiment of the present invention.

FIG. 28 illustrates the planar arrangement of microscopic openings of the front side power supply/grounding wiring (back side power supply/grounding wiring), as a variation of the arrangement of microscopic openings (orthogonal grid arrangement of slit openings) in the burn-in board used for the burn-in process of the method of manufacturing a semiconductor device according to the embodiment of the present invention. FIG. 29 illustrates the planar arrangement of microscopic openings of the front side power supply/grounding wiring (back side power supply/grounding wiring), as a variation of the arrangement of microscopic openings (staggered arrangement of dot-like openings) in the burn-in board used for the burn-in process of the method of manufacturing a semiconductor device according to the embodiment of the present invention. Referring to these figures, variations of the arrangement of microscopic openings in the burn-in board used for the burn-in process of the method of manufacturing a semiconductor device according to the embodiment of the present invention will be explained below.

(1) Slit Openings (See FIG. 28 and Related Figures)

The shape and arrangement of the microscopic openings 39 shown in FIGS. 11, 12, and 27 are not limited to the orthogonal grid arrangement of square openings but instead they may be an orthogonal grid arrangement of rectangular openings as shown in FIG. 28. An oblique grid arrangement of rectangular openings is also acceptable.

(2) Staggered Arrangement of Dot-Like Openings (See FIG. 29 and Related Figures)

The shape and arrangement of the microscopic openings 39 shown in FIGS. 11, 12, and 27 are not limited to the orthogonal grid arrangement of square openings but instead they may be an oblique orthogonal grid arrangement of square openings as shown in FIG. 29.

8. Supplementary Explanation of the Embodiments (Including Variations Thereof) and General Discussion As explained so far, in the aforementioned embodiments, in order to prevent defects in the mass production inspection step which are attributable to a burn-in board, grounding wiring or power supply wiring in the form of mesh extensive wiring is provided on at least one of the upper surface (where sockets are located) and lower surface of the organic multilayer wiring substrate as the body of the burn-in body to reduce the possibility of peeling of solder resist film.

In some of the aforementioned embodiments (for example, the one shown in FIG. 11 or 27), extensive wiring is also provided under the corner support portions of the socket in order to prevent damage to wiring or peeling of solder resist film due to pressure (handling pressure) applied from the bottom frame-shaped protrusion 29 to the wiring on the bottom frame-shaped protrusion and the upper surface of the organic multilayer wiring substrate as the body of the burn-in board or the solder resist film. Therefore, the relatively wide corner support portions are in a higher position, which prevents strong contact between the relatively narrow edge-like bottom frame-shaped protrusion and the wiring on the upper surface of the organic multilayer wiring substrate as the body of the burn-in board or the solder resist film.

9. Summary

The invention made by the present inventors has been so far explained concretely in reference to the preferred embodiments thereof. However, the invention is not limited thereto and it is obvious that these details may be modified in various ways without departing from the spirit and scope thereof.

For example, in the aforementioned embodiments, it is assumed that a glass epoxy multilayer wiring substrate is used for the organic multilayer wiring substrate of the burn-in board. However, the present invention is not limited thereto and it is needless to say that an organic multilayer wiring substrate which uses another type of organic insulating plate as a main insulating layer material may be used.

What is claimed is:

1. A method of manufacturing a semiconductor device comprising the steps of:
    (a) providing a plurality of semiconductor chips in which devices are formed;
    (b) assembling the plurality of semiconductor devices by forming an external terminal to be electrically connected with each of the semiconductor chips;
    (c) providing a burn-in board including a plurality of sockets over a front surface thereof;
    (d) performing a burn-in process on the semiconductor devices in such a state of loading the semiconductor devices in the sockets, respectively,
    the burn-in board further comprising:
    (x1) an organic multilayer wiring substrate including an internal signal wiring layer, a front side outermost power supply/grounding wiring layer, and a back side outermost power supply/grounding wiring layer;
    (x2) a front side power supply/grounding wiring which covers almost all of a front surface of the organic multilayer wiring substrate where the sockets are not provided, and which belongs to the front side outermost power supply/grounding wiring layer;
    (x3) a solder resist film which covers almost all of the front surface of the organic multilayer wiring substrate; and
    (x4) a plurality of microscopic openings formed over almost all of the front side power supply/grounding wiring that are covered and in contact with the solder resist film.

2. The method of manufacturing a semiconductor device according to claim 1, the sockets each comprising:
    (y1) a frame-shaped protrusion provided in the center of each peripheral edge on a back surface; and (y2) a corner support portion which is provided in each corner of the back surface and protrudes to the same extent as the frame-shaped protrusion.

3. The method of manufacturing a semiconductor device according to claim 2,
wherein the front side power supply/grounding wiring lies over the front surface of the organic multilayer wiring substrate under each of the corner support portions of the sockets.

4. The method of manufacturing a semiconductor device according to claim 3,
wherein the microscopic openings are formed all over the front side power supply/grounding wiring on the front surface of the organic multilayer wiring substrate under each of the corner support portions of the sockets.

5. The method of manufacturing a semiconductor device according to claim 4,
wherein the front side power supply/grounding wiring does not lie over the front surface of the organic multilayer wiring substrate in an area near an outside of the frame-shaped protrusion of each of the plurality of sockets.

6. The method of manufacturing a semiconductor device according to claim 3,
wherein the microscopic openings are not provided over the front side power supply/grounding wiring on the front surface of the organic multilayer wiring substrate under each of the corner support portions of the sockets.

7. The method of manufacturing a semiconductor device according to claim 1,
wherein each of the semiconductor devices is a resin-sealed semiconductor device and the external terminals are leads.

8. The method of manufacturing a semiconductor device according to claim 7,
wherein processing temperature of the burn-in process is about 125 degrees Celsius.

9. The method of manufacturing a semiconductor device according to claim 8,
wherein the front side power supply/grounding wiring is one of power supply wiring and grounding wiring and the back side power supply/grounding wiring is the other of the power supply wiring and the grounding wiring.

10. The method of manufacturing a semiconductor device according to claim 9,
wherein the burn-in process is performed with contact electrodes of the sockets being in contact with the external terminals of the semiconductor devices.

11. The method of manufacturing a semiconductor device according to claim 7,
wherein an aperture ratio of the front side power supply/grounding wiring is not less than 15% and not more than 35%.

12. The method of manufacturing a semiconductor device according to claim 9,
wherein the front side power supply/grounding wiring is the grounding wiring.

* * * * *